United States Patent
Machita et al.

(10) Patent No.: US 9,129,622 B2
(45) Date of Patent: Sep. 8, 2015

(54) CPP-TYPE MAGNETORESISTANCE EFFECT ELEMENT AND MAGNETIC DISK DEVICE

(71) Applicant: TDK Corporation, Tokyo (JP)

(72) Inventors: Takahiko Machita, Tokyo (JP); Naomichi Degawa, Tokyo (JP); Takekazu Yamane, Tokyo (JP); Takumi Yanagisawa, Tokyo (JP); Satoshi Miura, Tokyo (JP); Kenta Hamamoto, Tokyo (JP); Minoru Ota, Tokyo (JP); Kenzo Makino, Tokyo (JP); Shohei Kawasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 26 days.

(21) Appl. No.: 13/842,948

(22) Filed: Mar. 15, 2013

(65) Prior Publication Data

US 2014/0268405 A1    Sep. 18, 2014

(51) Int. Cl.
  *G11B 5/39* (2006.01)
  *H01L 43/08* (2006.01)
  *G01R 33/09* (2006.01)

(52) U.S. Cl.
  CPC ............ *G11B 5/3912* (2013.01); *G01R 33/093* (2013.01); *G01R 33/098* (2013.01); *G11B 5/3906* (2013.01); *G11B 5/398* (2013.01); *G11B 5/3932* (2013.01); *H01L 43/08* (2013.01)

(58) Field of Classification Search
  CPC ...... G01R 33/093; G01R 33/098; G11B 5/39; G11B 5/3906; G11B 5/3912; G11B 5/3929; G11B 5/398; G11B 5/3932
  USPC ......... 360/319, 324.1, 324.11, 324.12, 324.2, 360/313, 320
  See application file for complete search history.

(56) References Cited

U.S. PATENT DOCUMENTS

| | | | |
|---|---|---|---|
| 7,008,702 B2* | 3/2006 | Fukuzawa et al. | 428/811.2 |
| 2002/0085320 A1* | 7/2002 | Gill | 360/324.11 |
| 2005/0276997 A1* | 12/2005 | Hasegawa et al. | 428/811.3 |
| 2007/0279810 A1* | 12/2007 | Funayama et al. | 360/324.1 |
| 2009/0073616 A1* | 3/2009 | Shimazawa et al. | 360/319 |
| 2009/0135529 A1* | 5/2009 | Shimazawa et al. | 360/319 |
| 2010/0079917 A1* | 4/2010 | Miyauchi et al. | 360/319 |

* cited by examiner

*Primary Examiner* — Thomas Alunkal
(74) *Attorney, Agent, or Firm* — Posz Law Group, PLC

(57) ABSTRACT

A magnetoresistive effect element that prevents a recording medium from deteriorating by effectively inhibiting erroneous writing to a medium or the like includes a magnetoresistive effect part, and an upper shield layer and a lower shield layer that are laminated and formed in a manner sandwiching the magnetoresistive effect part from above and below, and is in a current perpendicular to plane (CPP) structure in which a sense current is applied in a lamination direction. The magnetoresistive effect part includes a nonmagnetic intermediate layer, and a first ferromagnetic layer and a second ferromagnetic layer that sandwich the nonmagnetic intermediate layer from above and below, the upper shield layer and the lower shield layer have inclined magnetization structures in which magnetizations of them are respectively inclined with respect to a track width direction, the magnetizations of the upper shield layer and the lower shield layer are mutually substantially orthogonal, the first ferromagnetic layer is indirectly magnetically coupled with the upper shield layer via a first exchange coupling function gap layer that is positioned between the first ferromagnetic layer and the upper shield layer, and the second ferromagnetic layer is indirectly magnetically coupled with the lower shield layer via a second exchange coupling function gap layer that is positioned between the second ferromagnetic layer and the lower shield layer.

13 Claims, 14 Drawing Sheets

CPP-TYPE MAGNETORESISTANCE EFFECT ELEMENT AND MAGNETIC DISK DEVICE

BACKGROUND OF THE INVENTION

1. Field of the Invention

The present invention relates to a magnetoresistive effect element for reading magnetic field intensity of a magnetic recording medium and the like as a signal, a thin film magnetic head that is provided with the magnetoresistive effect element, and a head gimbal assembly and a magnetic disk device that contain the thin film magnetic head.

2. Description of the Related Art

In recent years, along with the advancement of high recording density of a hard disk drive (HDD), further improvement is demanded in the performance of a thin film magnetic head. As a thin film magnetic head, a composite type thin film magnetic head is widely used having a structure in which a reproducing head having a read-only magnetoresistive effect element (MR element) and a recording head having a write-only induction-type magnetic transducer element are laminated.

Currently, as a reproducing head, a magnetoresistive effect element of a so-called CIP (Current In Plane) structure (CIP-GMR element) that is referred to as a spin-valve GMR element and that is operated by flowing a current in parallel to a film surface of the element is widely used. In a reproducing head, the spin-valve GMR element of such a structure is positioned between an upper and a lower shield layers formed with soft magnetic metal films and is arranged in a form of being sandwiched from above and below by insulation layers that are referred to as gap layers. A recording density in a bit direction is determined by a gap (reproduce gap length) between the upper and lower shield layers.

Along with the increase of the recording density, there is an increasing demand for a narrower shield gap and a narrower track with respect to the reproducing element of the reproducing head. Due to a narrower track of the reproducing element and a reduction in height of the element that accompanies the narrower track, an area of the element decreases. There is a problem that heat dissipation efficiency decreases as the area decreases in a conventional structure and thus an operation current is limited from a point of view of reliability.

In order to solve such a problem, a GMR element of a CPP (current perpendicular to plane) structure (CPP-GMR element) is proposed in which an upper and a lower shield layers (an upper shield layer and a lower shield layer) and an MR element are electrically connected in series and an intershield insulation layer is not needed. This is an essential technology for achieving a recording density that exceeds 200 Gbits/in$^2$.

Such a CPP-GMR element has a lamination structure containing a first ferromagnetic layer and a second ferromagnetic layer that are formed in a manner sandwiching a conductive nonmagnetic intermediate layer from both sides. The lamination structure of a typical spin-valve type CPP-GMR element is a lamination structure in which, from a substrate side, a lower electrode, an antiferromagnetic layer, a lower ferromagnetic layer, a conductive nonmagnetic intermediate layer, an upper ferromagnetic layer and an upper electrode are sequentially laminated.

A magnetization direction of the lower ferromagnetic layer, which is one of the ferromagnetic layers, is pinned in such a manner that, when an externally applied magnetic field is zero, it is perpendicular to a magnetization direction of the upper ferromagnetic layer. The magnetization direction of the lower ferromagnetic layer is pinned by having an antiferromagnetic layer adjacent to the lower ferromagnetic layer to impart unidirectional anisotropy energy (which is also referred to as an "exchange bias" or a "coupling magnetic field") in the lower ferromagnetic layer via an exchange coupling between the antiferromagnetic layer and the lower ferromagnetic layer. For this reason, the lower ferromagnetic layer is also referred to as a magnetization pinned layer. On the other hand, the upper ferromagnetic layer is also referred to as a free layer. Further, it is also proposed that the magnetization pinned layer (the lower ferromagnetic layer) have a three-layer structure of a ferromagnetic layer, a nonmagnetic metal layer and a ferromagnetic layer (so-called "laminated ferrimagnetic structure" or "synthetic pinned structure"). This allows a strong exchange coupling to be imparted between the two ferromagnetic layers of the magnetization pinned layer (the lower ferromagnetic layer) and the exchange-coupling force from the antiferromagnetic layer to be effectively increased, and in addition, this allows influence of a static magnetic field that is generated from the magnetization pinned layer on the free layer to be reduced. Therefore, the "synthetic pinned structure" is currently widely used.

However, in order to meet the demand for ultra-high recording density in recent years, further thinning of the MR element is required. In such circumstances, a new GMR element structure is proposed that has a simple three-layer lamination structure of a ferromagnetic layer, a nonmagnetic intermediate layer and a ferromagnetic layer as a basic structure as disclosed, for example, in U.S. Pat. No. 7,019,371B2, U.S. Pat. No. 7,035,062B1, and the like. In this GMR element structure, as illustrated in FIG. 17, two ferromagnetic layers 61, 62 are exchange-coupled in such a manner that the magnetizations 61a, 62a of the ferromagnetic layers 61, 62 are mutually antiparallel. A permanent magnet HM is arranged at a back-region position that is opposite to an air bearing surface (ABS) that corresponds to a medium-opposing surface of the element. An initial state is created by a bias magnetic field generated from the permanent magnet HM, in which the magnetizations 61a, 62a of the two ferromagnetic layers 61, 62 are respectively inclined about 45 degrees with respect to a track width direction and are substantially orthogonal to each other (see FIG. 18). When the element in this initial magnetization state detects a signal magnetic field from the medium, magnetization directions of the two ferromagnetic layers 61, 62 change in a way like that when a pair of scissors cuts a piece of paper. As a result, a resistance value of the element changes. For convenience, such an element structure is referred to as a DFL (Dual Free Layer) element structure in the present specification.

When the DFL element structure is applied to a TMR element or a CPP-GMR element, as compared to a common spin-valve type CPP-GMR element, a "read gap" that is a gap between the upper and lower shield layers 61, 62 can be significantly narrowed. Specifically, the antiferromagnetic layer that is needed for a common spin-valve type CPP-GMR element is no longer needed and, in addition, the ferromagnetic layer in the "synthetic pinned structure" is also no longer needed.

In order to form the DFL element structure in the conventional technology, it is necessary that the two ferromagnetic layers 61, 62 are exchange-coupled in such a manner that the magnetizations 61a, 62a of the two ferromagnetic layers 61, 62 are mutually antiparallel. Such a structure can be easily formed by inserting a noble metal such as Au, Ag, Cu, Ir, Rh, Ru or Cr between the two ferromagnetic layers 61, 62 to generate an exchange coupling between the two ferromagnetic layers 61, 62.

However, a disadvantage may occur in a TMR element, since an insulating film such as an aluminum oxide (AlOx)

film or a magnesium oxide (MgO) film must be interposed between the two ferromagnetic layers in order to obtain a tunneling effect, it is difficult to generate a strong exchange coupling between the two ferromagnetic layers. As a result, it is extremely difficult to have the magnetizations of the two ferromagnetic layers in an antiparallel state.

Further, in a head structure using the above-described DFL element structure in the conventional technology, in order to generate sufficient bias magnetic field intensity from the permanent magnet HM such as CoPt arranged at the back-region position that is opposite to the ABS to form the initial state, it is necessary to increase the thickness of the permanent magnet HM. Increasing the thickness of the permanent magnet HM means that a merit that the DFL element structure is a structure in which the read gap can be narrowed cannot be fully enjoyed. To increase the thickness of the permanent magnet HM and narrow the read gap will reduce gaps between the permanent magnet HM and an upper and a lower shield layers 71, 72 and a problem may occur that the bias magnetic field generated from the permanent magnet HM leaks to the upper and the lower shield layers 71, 72 so that the application of the bias magnetic field to the element becomes insufficient, and the resistance change of the element cannot be sufficiently detected.

Further, in the head structure using the above-described the DFL element structure in the conventional technology, the permanent magnet HM is arranged at the back-region position that is opposite to the ABS, and the above-described initial state in the two ferromagnetic layers 61, 62 is formed by applying the bias magnetic field from the permanent magnet HM to the two ferromagnetic layers 61, 62. However, a problem may also occur that there is a risk that the bias magnetic field from the permanent magnet HM may leak from the element, and due to the leakage magnetic field, a signal may be erroneously written to a medium, or a signal recorded in a medium may be demagnetized or degaussed.

SUMMARY OF THE INVENTION

In order to meet the demand for ultra-high recording density in recent years, the purpose of the present invention is to provide a magnetoresistive effect element, a thin film magnetic head that is provided with the magnetoresistive effect element, and a head gimbal assembly and a magnetic disk device that contain the thin film magnetic head, the magnetoresistive effect element allowing a linear recording density to be improved by adopting a structure in which the read gap (the gap between the upper and the lower shield layers) can be narrowed and also allowing a medium to be prevented from deteriorating by effectively inhibiting erroneous writing to the medium, demagnetization and degaussing of a recorded signal.

In order to achieve the purpose, the present invention is to provide a magnetoresistive effect element of a current perpendicular to plane (CPP) structure in which a sense current is applied in a lamination direction, the magnetoresistive effect element comprising a magnetoresistive effect part; and an upper shield layer and a lower shield layer that are laminated and formed in a manner sandwiching the magnetoresistive effect part from above and below, wherein the magnetoresistive effect part comprises a nonmagnetic intermediate layer, and a first ferromagnetic layer and a second ferromagnetic layer that are laminated and formed in a manner sandwiching the nonmagnetic intermediate layer from above and below, the upper shield layer and the lower shield layer have inclined magnetization structures in which magnetizations of the upper shield layer and the lower shield layer are respectively inclined with respect to a track width direction, the magnetizations of the upper shield layer and the lower shield layer are mutually substantially orthogonal, the first ferromagnetic layer is indirectly magnetically coupled with the upper shield layer via a first exchange coupling function gap layer that is positioned between the first ferromagnetic layer and the upper shield layer, and the second ferromagnetic layer is indirectly magnetically coupled with the lower shield layer via a second exchange coupling function gap layer that is positioned between the second ferromagnetic layer and the lower shield layer (first invention).

According to the above invention (first invention), it is preferred that the upper shield layer comprises an upper nonmagnetic layer; and a first upper shield layer and a second upper shield layer that are laminated and formed in a manner sandwiching the upper nonmagnetic layer from above and below, the first upper shield layer and the second upper shield layer are exchange-coupled via the upper nonmagnetic layer in such a manner that magnetizations of the first upper shield layer and the second upper shield layer are respectively inclined with respect to the track width direction and are mutually antiparallel, the magnetizations of the first upper shield layer and the lower shield layer are mutually substantially orthogonal, the first exchange coupling function gap layer is positioned between the first ferromagnetic layer and the first upper shield layer, and the first ferromagnetic layer is indirectly magnetically coupled with the first upper shield layer via the first exchange coupling function gap layer (second invention).

According to the above invention (first invention), it is preferred that the lower shield layer comprises a lower nonmagnetic layer, and a first lower shield layer and a second lower shield layer that are laminated and formed in a manner sandwiching the lower nonmagnetic layer from above and below, the first lower shield layer and the second lower shield layer are exchange-coupled via the lower nonmagnetic layer in such a manner that magnetizations of the first lower shield layer and the second lower shield layer are respectively inclined with respect to the track width direction and are mutually antiparallel, the magnetizations of the second lower shield layer and the upper shield layer are mutually substantially orthogonal, the second exchange coupling function gap layer is positioned between the second ferromagnetic layer and the second lower shield layer, and the second ferromagnetic layer is indirectly magnetically coupled with the second lower shield layer via the second exchange coupling function gap layer (third invention).

According to the above invention (first invention), it is preferred that the upper shield layer comprises an upper nonmagnetic layer; and a first upper shield layer and a second upper shield layer that are laminated and formed in a manner sandwiching the upper nonmagnetic layer from above and below, the lower shield layer comprises a lower nonmagnetic layer; and a first lower shield layer and a second lower shield layer that are laminated and formed in a manner sandwiching the lower nonmagnetic layer from above and below, the first upper shield layer and the second upper shield layer are exchange-coupled via the upper nonmagnetic layer in such a manner that magnetizations of the first upper shield layer and the second upper shield layer are respectively inclined with respect to the track width direction and are mutually antiparallel, the first lower shield layer and the second lower shield layer are exchange-coupled via the lower nonmagnetic layer in such a manner that magnetizations of the first lower shield layer and the second lower shield layer are respectively inclined with respect to the track width direction and are mutually antiparallel, the magnetizations of the first upper shield layer and the second lower shield layer are mutually substantially orthogonal, the first exchange coupling function gap layer is positioned between the first ferromagnetic layer and the first upper shield layer, the second exchange coupling function gap layer is positioned between the second ferromagnetic layer and the second lower shield layer, the first ferromagnetic layer is indirectly magnetically coupled with the first upper shield layer via the first exchange coupling function gap layer, and the second ferromagnetic layer is indirectly magnetically coupled with the second lower shield layer via the second exchange coupling function gap layer (fourth invention).

According to the above invention (first invention), it is preferred that the first exchange coupling function gap layer sequentially includes, from the upper shield layer side, an exchange coupling transmitting layer, a gap adjustment layer and an exchange coupling adjustment layer, and the second exchange coupling function gap layer sequentially includes, from the lower shield layer side, an exchange coupling transmitting layer, a gap adjustment layer and an exchange coupling adjustment layer (fifth invention), and it is further preferred that the first exchange coupling function gap layer sequentially includes, from the upper shield layer side, an exchange coupling transmitting layer, a gap adjustment layer and an exchange coupling adjustment layer, and the second exchange coupling function gap layer sequentially includes, from the lower shield layer side, an exchange coupling transmitting layer, a gap adjustment layer and an exchange coupling adjustment layer (sixth invention).

According to the above invention (first invention), it is preferred that the magnetoresistive effect element is sandwiched from above and below by a first antiferromagnetic layer that is adjacent to the upper shield layer and a second antiferromagnetic layer that is adjacent to the lower shield layer, the magnetization of the upper shield layer is pinned due to an exchange coupling between the upper shield layer and the first antiferromagnetic layer, and the magnetization of the lower shield layer is pinned due to an exchange coupling between the lower shield layer and the second antiferromagnetic layer (seventh invention).

According to the above invention (seventh invention), it is preferred that a blocking temperature of the second antiferromagnetic layer is higher than a blocking temperature of the first antiferromagnetic layer (eighth invention).

According to the above invention (first invention), it is preferred that, when viewed from a medium-opposing surface side of the magnetoresistive effect element, a bias magnetic field application part that applies a bias magnetic field to the first ferromagnetic layer and the second ferromagnetic layer is not provided on a back-region side of the magnetoresistive effect part (ninth invention).

Also, the present invention provides a thin film magnetic head that comprises a medium-opposing surface opposing a recording medium; and the magnetoresistive effect element of the above invention (first invention) that is arranged in a vicinity of the medium-opposing surface for detecting a signal magnetic field from the recording medium (tenth invention).

Further, the present invention provides a head gimbal assembly that comprises a slider that contains the thin film magnetic head of the above invention (tenth invention) and is arranged opposing a recording medium; and a suspension that elastically supports the slider.

Furthermore, the present invention provides a magnetic disk device that comprises a slider that contains the thin film magnetic head of the above invention (tenth invention) and is arranged opposing a recording medium; and a positioning device that supports the slider and positions the slider with respect to the recording medium (twelfth invention).

According to the present invention, in order to meet the demand for ultra-high recording density in recent years, a magnetoresistive effect element, a thin film magnetic head that is provided with the magnetoresistive effect element, and a head gimbal assembly and a magnetic disk device that contain the thin film magnetic head can be provided, the magnetoresistive effect element allowing a linear recording density to be improved by adopting a structure in which the read gap (the gap between the upper and the lower shield layers) can be narrowed and also allowing a medium to be prevented from deteriorating by preventing erroneous writing to the medium.

DESCRIPTION OF THE PREFERRED EMBODIMENTS

Before explaining an embodiment of the present invention, terms used in the present specification are defined. In the present specification, a length in an X-axis direction illustrated in each drawing is referred to as a "width," a length in a Y-axis direction is referred to as a "length," and a length in a Z-axis direction is referred to as a "thickness." Further, in the Y-axis direction, a side close to an ABS (surface of a thin film magnetic head opposing to a recording medium) is referred to as a "front" side and an opposite side (back-region side) of the "front" side is referred to as a "rear" side. Further, in a lamination structure of an element or an element structure, when viewed from a referencing layer or element, a substrate direction is referred to as "downward" or "lower side" and an opposite direction of the substrate direction is referred to as "upward" or "upper side."

[Magnetoresistive Effect Element]

A magnetoresistive effect element according to an embodiment of the present invention is explained with reference to the drawings.

Figure 1:
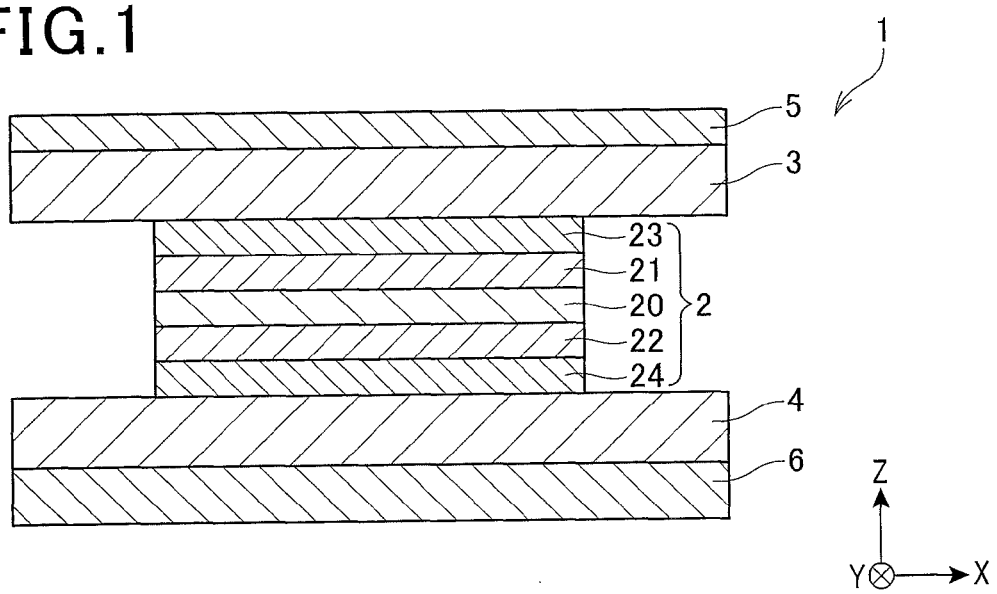
FIG. 1 is a plan view viewed from an ABS side schematically illustrating a magnetoresistive effect element of a CPP structure (CPP-MR element) according to an embodiment of the present invention.

FIG. 1 is a plan view viewed from an ABS side schematically illustrating a magnetoresistive effect element of a CPP structure (CPP-MR element) in a reproducing head according to the present embodiment.

Figure 2:
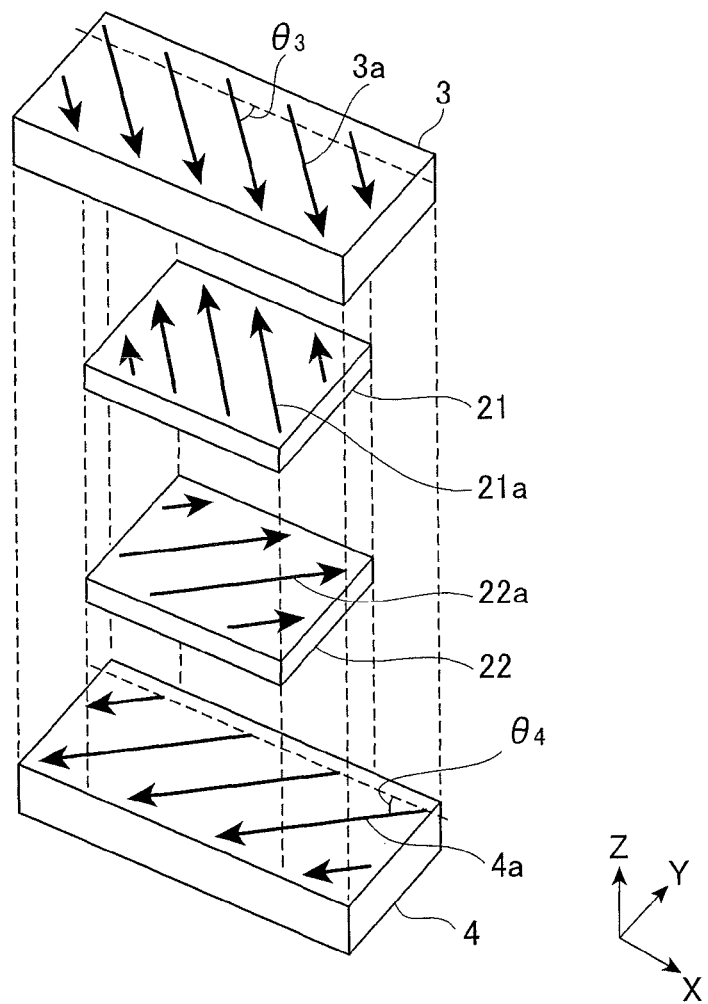
FIG. 2 is an exploded perspective view, in which each configuration component is separately illustrated to explain a structure of a magnetoresistive effect element according to an embodiment of the present invention.

FIG. 2 is an exploded perspective view, in which each configuration component is separately illustrated, for explaining a structure of the magnetoresistive effect element according to the present embodiment.

As illustrated in FIG. 1, a magnetoresistive effect element 1 has a magnetoresistive effect part (MR part) 2, and an upper shield layer 3 and a lower shield layer 4 that are arranged and formed in a manner sandwiching the MR part 2 from above and below, and has a CPP (Current Perpendicular to Plane) structure in which a sense current is applied in a lamination direction.

Magnetoresistive Effect Part

The MR part 2 has a nonmagnetic intermediate layer 20, and a first ferromagnetic layer 21 and a second ferromagnetic layer 22 that are laminated and formed in a manner of sandwiching the nonmagnetic intermediate layer 20 from above and below. A multilayer body of these three layers (the first ferromagnetic layer 21, the nonmagnetic intermediate layer 20 and the second ferromagnetic layer 22) is a sensor region and has a total thickness of about 10-30 nm. Further, the MR part 2 has a first exchange coupling function gap layer 23 and a second exchange coupling function gap layer 24 that are respectively interposed between the sensor region and an upper shield layer 3 and a lower shield layer 4. On each of both sides of the MR part 2 in a track width direction (X-direction), a nonmagnetic layer (insulation layer) or the like (not illustrated) made of alumina ($Al_2O_3$) or the like is arranged for defining a track width for reading.

Each of the first ferromagnetic layer 21 and the second ferromagnetic layer 22 functions as a so-called free layer in which a direction of magnetization changes under the influence of an externally applied magnetic field (external magnetic field) in response to the external magnetic field.

Examples of a material that forms the first ferromagnetic layer 21 and the second ferromagnetic layer 22 include NiFe, CoFe, CoFeB, CoFeNi, $Co_2MnSi$, $Co_2MnGe$, $FeO_x$ (oxide of Fe), or the like. Each of the first ferromagnetic layer 21 and the second ferromagnetic layer 22 can have a thickness of about 0.5-8 nm.

The nonmagnetic intermediate layer 20 is an essential film for generating a magnetoresistive effect (MR effect) in the magnetoresistive effect element 1 according to the present embodiment. Examples of a material that forms the nonmagnetic intermediate layer 20 include Cu, Au, Ag, Zn, Ga, $TiO_x$, ZnO, InO, SnO, GaN, ITO (indium tin oxide), $Al_2O_3$, MgO, or the like. Preferably, the nonmagnetic intermediate layer 20 is configured by a lamination film of two or more layers. For example, it is preferable that the nonmagnetic intermediate layer 20 is configured by a three-layer lamination film of Cu/ZnO/Cu. Further, configuring the nonmagnetic intermediate layer 20 by a three-layer lamination film of Cu/ZnO/Zn (in which one of the two Cu layers is replaced by a Zn layer) allows output to be improved and thus is preferable. The nonmagnetic intermediate layer 20 can have a thickness of about 0.5-5 nm.

As described later, in the present embodiment, magnetizations $3a$, $4a$ of the upper shield layer 3 and the lower shield layer 4 are respectively inclined at predetermined angles $\theta_3$, $\theta_4$ and are mutually substantially orthogonal. The upper shield layer 3 and the lower shield layer 4 are respectively indirectly magnetically coupled with the first ferromagnetic layer 21 and the second ferromagnetic layer 22 that function as the so-called free layers, by respectively interposing the first exchange coupling function gap layer 23 and the second exchange coupling function gap layer 24. Thereby, magnetizations $21a$, $22a$ of the first ferromagnetic layer 21 and the second ferromagnetic layer 22 are mutually substantially orthogonal. Therefore, in the present embodiment, there is no need to exchange-couple the first ferromagnetic layer 21 and the second ferromagnetic layer 22. Therefore, an oxide semiconductor such as ZnO can be used as the material that forms the nonmagnetic intermediate layer 20 that is interposed between the first ferromagnetic layer 21 and the second ferromagnetic layer 22. As a result, as compared to a magnetoresistive effect element in which a metal intermediate layer (such as Ag and Cu) is interposed between the first ferromagnetic layer 21 and the second ferromagnetic layer 22, the influence of a spin torque due to a current flowing in the lamination direction of the element can be suppressed and the magnetoresistive ratio (MR ratio) can be improved. Further, there is no need to exchange-couple the first ferromagnetic layer 21 and the second ferromagnetic layer 22. Thereby, the range of choices for the constituent material of the nonmagnetic intermediate layer 20 is widened and the degree of freedom in design is increased.

Upper Shield Layer and Lower Shield Layer

The upper shield layer 3 and the lower shield layer 4 function as magnetic shields that shield the element from an external magnetic field and function as electrodes when a sense current is flowed. In the present embodiment, the upper shield layer 3 and the lower shield layer 4 may not function as the electrodes. It is also possible to have a configuration in which, separated from the upper shield layer 3 and the lower shield layer 4, new electrode layers are additionally laminated.

Examples of a material that forms the upper shield layer 3 and the lower shield layer 4 include NiFe (permalloy), CoZrTa, sendust, NiFeCo, CoZrNb, or the like. Further, the upper shield layer 3 and the lower shield layer 4 can have a thickness (in the Z-direction) of about 20 nm-3 μm.

As illustrated in FIG. 2, the upper shield layer 3 and the lower shield layer 4 have inclined magnetization structures in which the magnetizations 3a, 4a of the upper shield layer 3 and the lower shield layer 4 are respectively inclined at predetermined angles $\theta_3$, $\theta_4$ (about 30-60 degrees, or preferably about 45 degrees) with respect to the track width direction (X-direction). The magnetization 3a of the upper shield layer 3 and the magnetization 4a of the lower shield layer 4 are mutually substantially orthogonal. That the magnetization 3a of the upper shield layer 3 and the magnetization 4a of the lower shield layer 4 are substantially orthogonal means that an angle formed therebetween can be about 90±15 degrees.

A first antiferromagnetic layer 5 is adjacently formed above the upper shield layer 3, and a second antiferromagnetic layer 6 is adjacently formed below the lower shield layer 4. As a result, the magnetization 3a of the upper shield layer 3 is pinned in a state inclined at the predetermined angle $\theta_3$ with respect to the track width direction (X-direction) by an exchange coupling between the upper shield layer 3 and the first antiferromagnetic layer 5. Further, the magnetization 4a of the lower shield layer 4 is pinned in a state inclined at the predetermined angle $\theta_4$ with respect to the track width direction (X-direction) by an exchange coupling between the lower shield layer 4 and the second antiferromagnetic layer 6.

As described above, the first exchange coupling function gap layer 23 is interposed between the upper shield layer 3 and the first ferromagnetic layer 21 and the second exchange coupling function gap layer 24 is interposed between the lower shield layer 4 and the second ferromagnetic layer 6. As a result, the first ferromagnetic layer 21 is indirectly magnetically coupled via the first exchange coupling function gap layer 23 with the upper shield layer 3 in which the direction of the magnetization 3a inclines at the predetermined angle $\theta_3$ with respect to the track width direction (X-direction). Further, the second ferromagnetic layer 22 is indirectly magnetically coupled via the second exchange coupling function gap layer 24 with the lower shield layer 4 in which the direction of the magnetization 4a inclines at the predetermined angle $\theta_4$ with respect to the track width direction (X-direction).

In this way, in the magnetoresistive effect element 1 according to the present embodiment, the upper shield layer 3 and the lower shield layer 4 have inclined magnetization structures in which the magnetizations 3a, 4a of the upper shield layer 3 and the lower shield layer 4 are inclined at the predetermined angles $\theta_3$, $\theta_4$ with respect to the track width direction (X-direction) and the magnetizations 3a, 4a are mutually substantially orthogonal. Thereby, the magnetizations 21a, 22a of the first ferromagnetic layer 21 and the second ferromagnetic layer 22 that are respectively indirectly magnetically coupled with the upper shield layer 3 and the lower shield layer 4 are also mutually substantially orthogonal. Therefore, according to the magnetoresistive effect element 1 of the present embodiment, without applying a bias magnetic field to the first ferromagnetic layer 21 and the second ferromagnetic layer 22, the magnetizations 21a, 22a of the first ferromagnetic layer 21 and the second ferromagnetic layer 22 can be mutually substantially orthogonal. In other words, there is no need to arrange a bias magnetic field application part such as a hard magnet on a back-region side of the first ferromagnetic layer 21 and the second ferromagnetic layer 22 in order to apply a bias magnetic field thereto. As a result, the so-called "read gap" can be narrowed and erroneous writing to a medium due to a leakage magnetic field from a bias magnetic field application part can be effectively inhibited. That the magnetization 21a of the first ferromagnetic layer 21 and the magnetization 22a of the second ferromagnetic layer 22 are substantially orthogonal means that an angle formed therebetween can be about 90±15 degrees.

Figure 3:
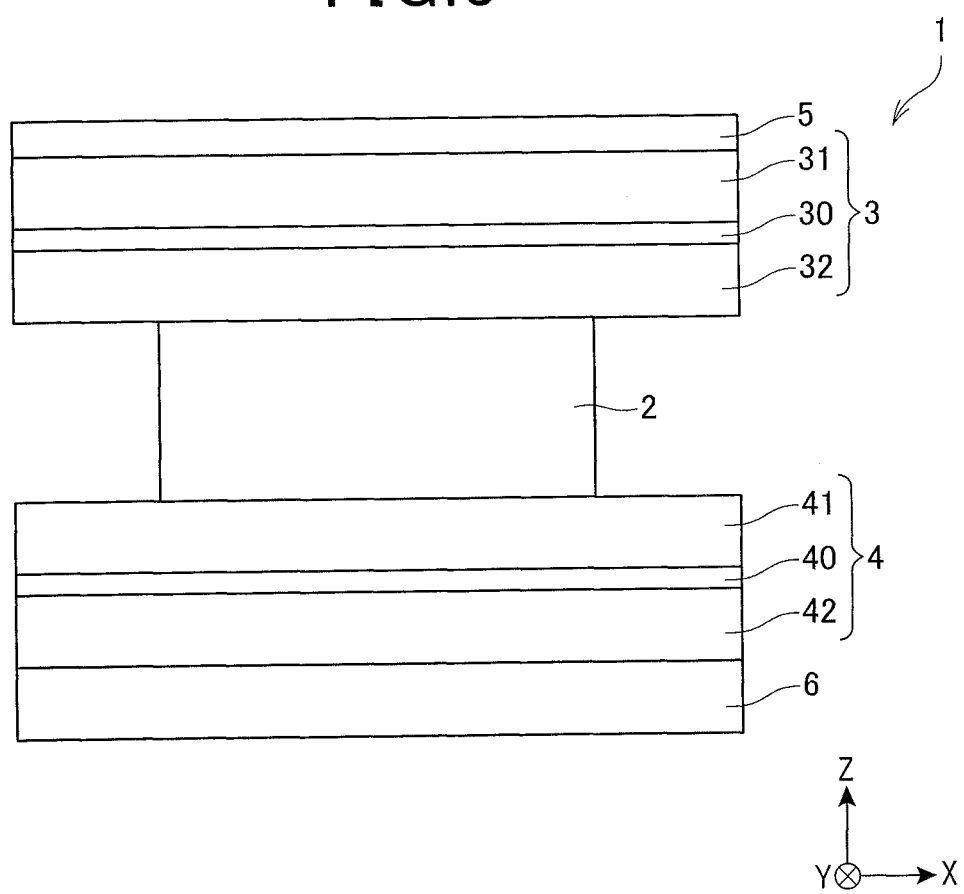
FIG. 3 is a plan view viewed from an ABS side schematically illustrating another configuration example of a magnetoresistive effect element according to an embodiment of the present invention.

As illustrated in FIG. 3, it is preferable that the upper shield layer 3 has an upper nonmagnetic layer 30, a first upper shield layer 31 and a second upper shield layer 32 that are laminated and formed in a manner of sandwiching the upper nonmagnetic layer 30 from above and below.

Figure 4A:
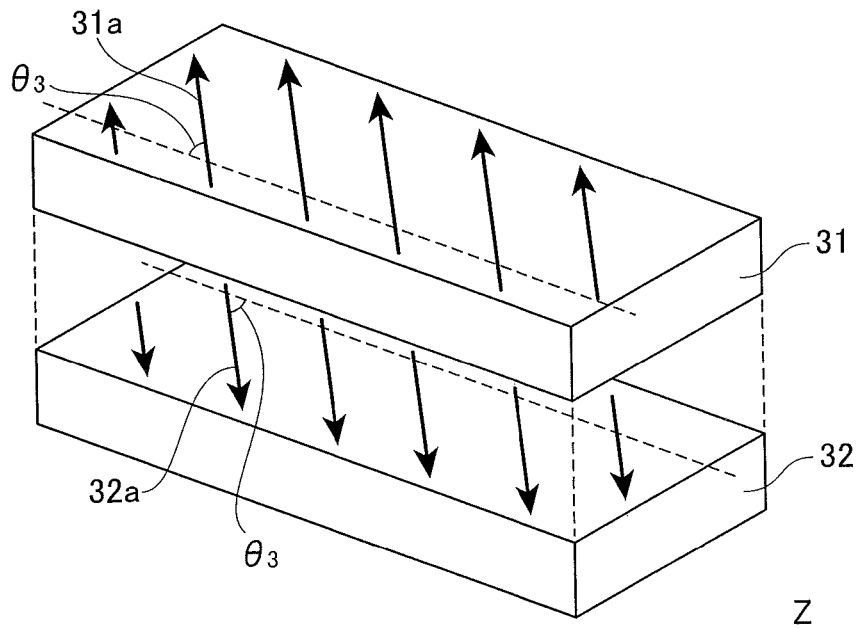
FIG. 4A is an exploded perspective view schematically illustrating a magnetization state of an upper shield layer in the magnetoresistive effect element illustrated in FIG. 3.

In this case, the first upper shield layer 31 that is formed adjacent to the first antiferromagnetic layer 5 and the second upper shield layer 32 have inclined magnetization structures in which magnetizations 31a, 32a of the first upper shield layer 31 and the second upper shield layer 32 are respectively inclined at the predetermined angle $\theta_3$ with respect to the track width direction (X-direction), and are exchange-coupled via the upper nonmagnetic layer 30 in such a manner that the magnetizations 31a, 32a are in an mutually antiparallel state (see FIG. 4A).

Further, as illustrated in FIG. 3, it is preferable that the lower shield layer 4 also similarly has a lower nonmagnetic layer 40, a first lower shield layer 41 and a second lower shield layer 42 that are laminated and formed in a manner of sandwiching the lower nonmagnetic layer 40 from above and below.

Figure 4B:
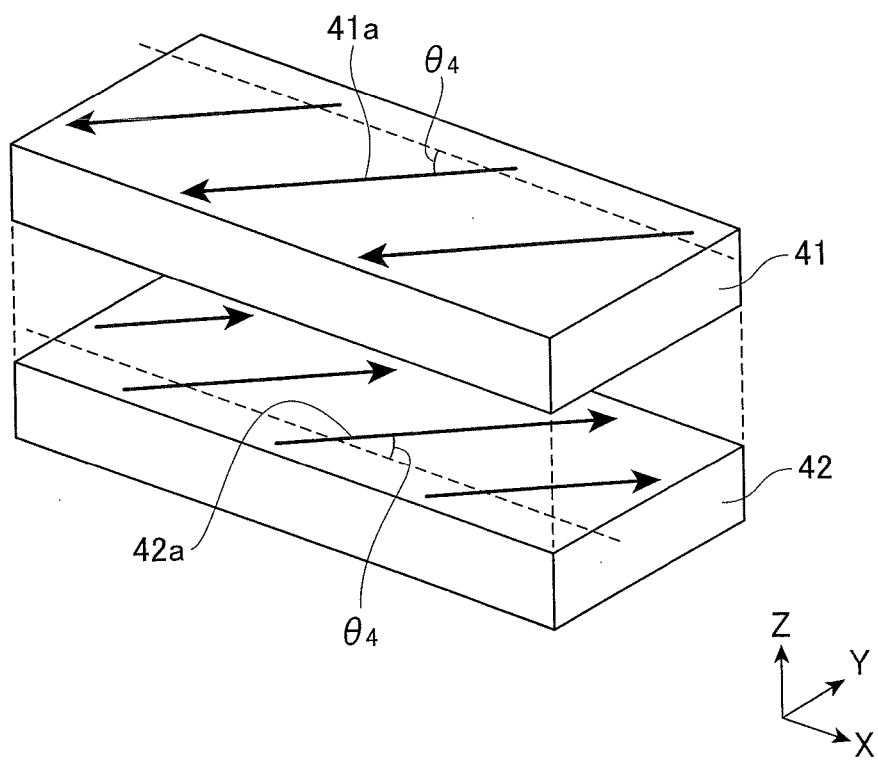
FIG. 4B is an exploded perspective view schematically illustrating a magnetization state of a lower shield layer in the magnetoresistive effect element illustrated in FIG. 3.

In this case, the first lower shield layer 41 and the second lower shield layer 42 that is formed adjacent to the second antiferromagnetic layer 6 have inclined magnetization structures in which magnetizations 41a, 42a of the first lower shield layer 41 and the second lower shield layer 42 are respectively inclined at the predetermined angle $\theta_4$ with respect to the track width direction (X-direction), and are exchange-coupled via the lower nonmagnetic layer 40 in such a manner that the magnetizations 41a, 42a are in an mutually antiparallel state (see FIG. 4B).

By having such a configuration, the magnetizations 31a, 32a of the first upper shield layer 31 and the second upper shield layer 32 and the magnetizations 41a, 42a of the first lower shield layer 41 and the second lower shield layer 42 are respectively in mutually antiparallel states. Therefore, the leakage magnetic fields from the upper shield layer 3 and the lower shield layer 4 can be further inhibited. As a result, erroneous writing to a medium and demagnetization or degaussing due to the leakage magnetic fields from the upper shield layer 3 and the lower shield layer 4 can be effectively prevented.

First and Second Exchange Coupling Function Gap Layers

Figure 5:
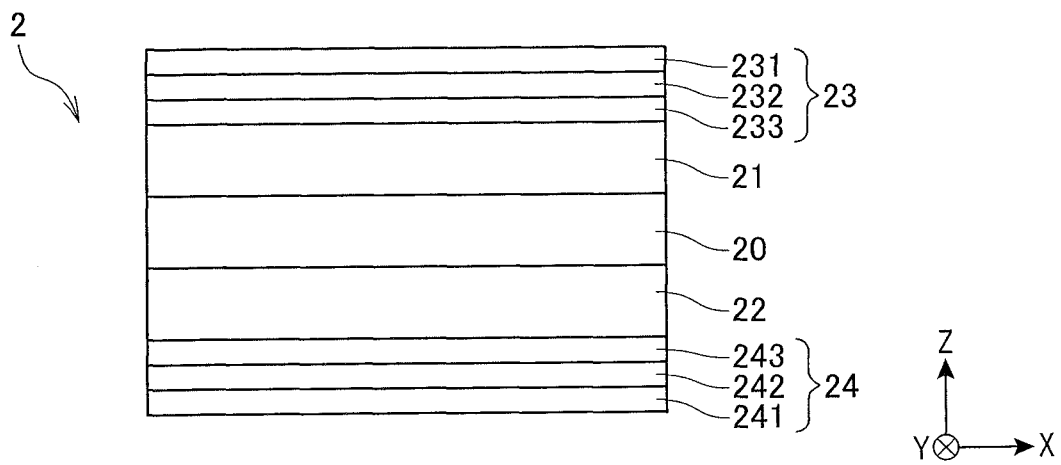
FIG. 5 is a plan view viewed from an ABS side schematically illustrating a magnetoresistive effect part in an embodiment of the present invention.

As illustrated in FIG. 5, as viewed downward from the upper shield layer 3 side, the first exchange coupling function gap layer 23 includes an exchange coupling transmitting layer 231, a gap adjustment layer 232 and an exchange coupling adjustment layer 233. The gap adjustment layer 232 is a so-called ferromagnetic layer that is formed with a ferromagnetic material.

The exchange coupling transmitting layer 231 is formed with at least one material selected from a group including Ru, Rh, Ir, Cr, Cu, Ag, Au, Pt and Pd. By respectively setting the material that forms the exchange coupling transmitting layer 231 and a thickness thereof, the strength of the magnetic coupling between the magnetization 3a of the upper shield layer 3 and the magnetization of the gap adjustment layer 232 can be adjusted. Further, by setting the material that forms the exchange coupling transmitting layer 231 and the thickness thereof, the orientation of the magnetization of the gap adjustment layer 232 that magnetically couples with the magnetization 3a of the upper shield layer 3 can be adjusted. That is, whether the coupling between the layers is an antiferromagnetic coupling in which the magnetizations are mutually oriented in opposite directions (antiparallel) and magnetically coupled or a ferromagnetic coupling in which the magnetizations are mutually oriented in the same direction (parallel) and magnetically coupled can be adjusted by selecting the material and the thickness of the exchange coupling transmitting layer 231.

The exchange coupling adjustment layer 233 is formed with at least one material selected from a group including Ru, Rh, Ir, Cr, Cu, Ag, Au, Pt and Pd. By respectively setting the material that forms the exchange coupling adjustment layer 233 and the thickness thereof, the strength of the magnetic coupling between the magnetization of the gap adjustment layer 232 and the magnetization 21a of the first ferromagnetic layer 21 can be adjusted. Further, by setting the material that forms the exchange coupling adjustment layer 233 and the thickness thereof, the orientation of the magnetization 21a of the first ferromagnetic layer 21 that magnetically couples with the magnetization of the gap adjustment layer 232 can be adjusted. That is, whether the coupling between the layers is an antiferromagnetic coupling in which the magnetizations are mutually oriented in opposite directions (antiparallel) and magnetically coupled or a ferromagnetic coupling in which the magnetizations are mutually oriented in the same direction (parallel) and magnetically coupled can be adjusted by selecting the material and the thickness of the exchange coupling adjustment layer 233.

In the present embodiment, it is necessary that the first ferromagnetic layer 21 functions as a so-called free layer that responds with high sensitivity to an external magnetic field. Therefore, the materials and the thicknesses of the exchange coupling transmitting layer 231 and the exchange coupling adjustment layer 233 can be set in such a manner that the strength of the magnetic coupling between the magnetization 3a of the upper shield layer 3 and the magnetization of the gap adjustment layer 232 is large while the strength of the magnetic coupling between the magnetization of the gap adjustment layer 232 and the magnetization 21a of the first ferromagnetic layer 21 is relatively small.

The thickness of the first exchange coupling function gap layer 23 can be set to be about 1.5-6.0 nm.

As viewed upward from the lower shield layer 4 side, the second exchange coupling function gap layer 24 includes an exchange coupling transmitting layer 241, a gap adjustment layer 242 and an exchange coupling adjustment layer 243. The gap adjustment layer 242 is a so-called ferromagnetic layer that is formed with a ferromagnetic material.

The exchange coupling transmitting layer 241 is formed with at least one material selected from a group including Ru, Rh, Ir, Cr, Cu, Ag, Au, Pt and Pd. By respectively setting the material that forms the exchange coupling transmitting layer 241 and a thickness thereof, the strength of the magnetic coupling between the magnetization 4a of the lower shield layer 4 and the magnetization of the gap adjustment layer 242 can be adjusted. Further, by setting the material that forms the exchange coupling transmitting layer 241 and the thickness thereof, the orientation of the magnetization of the gap adjustment layer 242 that magnetically couples with the magnetization 4a of the lower shield layer 4 can be adjusted. That is, whether the coupling between the layers is an antiferromagnetic coupling in which the magnetizations are mutually oriented in opposite directions (antiparallel) and magnetically coupled or a ferromagnetic coupling in which the magnetizations are mutually oriented in the same direction (parallel) and magnetically coupled can be adjusted by selecting the material and the thickness of the exchange coupling transmitting layer 241.

The exchange coupling adjustment layer 243 is formed with at least one material selected from a group including Ru, Rh, Ir, Cr, Cu, Ag, Au, Pt and Pd. By respectively setting the material that forms the exchange coupling adjustment layer 243 and the thickness thereof, the strength of the magnetic coupling between the magnetization of the gap adjustment layer 242 and the magnetization 22a of the second ferromagnetic layer 22 can be adjusted. Further, by setting the material that forms the exchange coupling adjustment layer 243 and the thickness thereof, the orientation of the magnetization 22a of the second ferromagnetic layer 22 that magnetically couples with the magnetization of the gap adjustment layer 242 can be adjusted. That is, whether the coupling between the layers is an antiferromagnetic coupling in which the magnetizations are mutually oriented in opposite directions (antiparallel) and magnetically coupled or a ferromagnetic coupling in which the magnetizations are mutually oriented in the same direction (parallel) and magnetically coupled can be adjusted by selecting the material and the thickness of the exchange coupling adjustment layer 243.

In the present embodiment, it is necessary that, similar to the first ferromagnetic layer 21, the second ferromagnetic layer 22 functions as a so-called free layer that responds with high sensitivity to an external magnetic field. Therefore, the materials and the thicknesses of the exchange coupling transmitting layer 241 and the exchange coupling adjustment layer 243 can be set in such a manner that the strength of the magnetic coupling between the magnetization 4a of the lower shield layer 4 and the magnetization of the gap adjustment layer 242 is large while the strength of the magnetic coupling between the magnetization of the gap adjustment layer 242 and the magnetization 22a of the second ferromagnetic layer 22 is relatively small.

The thickness of the second exchange coupling function gap layer 24 can be set to be about 1.5-6.0 nm.

A predetermined gap corresponding to a recording density is required between the sensor region (the first ferromagnetic layer 21, the nonmagnetic intermediate layer 20 and the second ferromagnetic layer 22) and each of the upper shield layer 3 and the lower shield layer 4. This is in order to surely take in external magnetic field as a signal to the sensor region. When the gap is larger than required, there occurs a risk that, in addition to the signal magnetic field to be taken in, adjacent other signal magnetic fields may also be taken in to the sensor region. Further, when the gap is less than a required distance and is too small, there occurs a risk that the signal magnetic field to be taken in to the sensor region may be absorbed by the upper shield layer 3 and the lower shield layer 4 that surround the sensor region and cannot be taken in to the sensor region.

In the magnetoresistive effect element 1 according to the present embodiment, by having the first exchange coupling function gap layer 23 and the second exchange coupling function gap layer 24, the above-described predetermined gap can be ensured.

Figure 6:
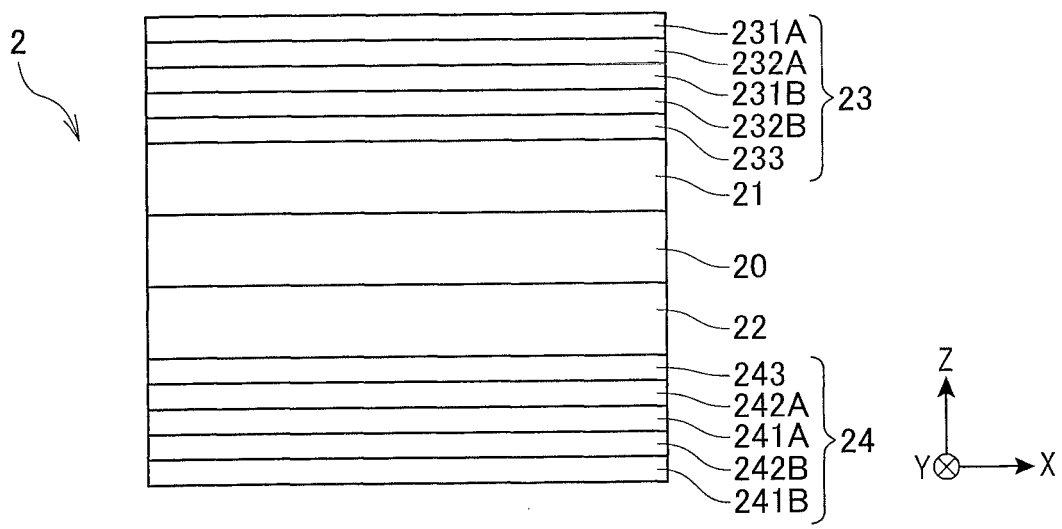
FIG. 6 is a plan view viewed from an ABS side schematically illustrating another configuration example of a magnetoresistive effect part in an embodiment of the present invention.

In the MR part 2 according to the present embodiment, the first exchange coupling function gap layer 23 and the second exchange coupling function gap layer 24 may also have configurations as illustrated in FIG. 6.

As illustrated in FIG. 6, as viewed downward from the upper shield layer 3 side, the first exchange coupling function gap layer 23 can have a configuration that sequentially includes a first exchange coupling transmitting layer 231A, a first gap adjustment layer 232A, a second exchange coupling transmitting layer 231B, a second gap adjustment layer 232B and an exchange coupling adjustment layer 233. Further, as viewed upward from the lower shield layer 4 side, the second exchange coupling function gap layer 24 can have a configuration that sequentially includes a second exchange coupling transmitting layer 241B, a second gap adjustment layer 242B, a first exchange coupling transmitting layer 241A, a first gap adjustment layer 242A and an exchange coupling adjustment layer 243. The first and second exchange coupling transmitting layers 231A, 231B, 241A, 241B, the first and second gap adjustment layers 232A, 232B, 242A, 242B and the exchange coupling adjustment layers 233, 243 all have the same configurations as the exchange coupling transmitting layers 231, 241, the gap adjustment layers 232, 242 and the exchange coupling adjustment layers 233, 243 that are illustrated in FIG. 5.

In each of the first exchange coupling function gap layer 23 and second exchange coupling function gap layer 24 of the MR part 2 illustrated in FIG. 6, the magnetization amounts MSt of the two ferromagnetic layers of the first gap adjustment layers 232A, 242A and the second gap adjustment layers 232B, 242B match each other and the two ferromagnetic layers are mutually strongly antiferromagnetically coupled, thereby, allowing a response to an external magnetic field to be zero. Therefore, by having the first exchange coupling function gap layer 23 and the second exchange coupling function gap layer 24 of such configurations, the MR part 2 of a particularly preferred embodiment can be made. Further, even when the first and second exchange coupling transmitting layers 231A, 231B, 241A, 241B have relatively weak coupling strengths, it is possible to ensure that these layers can function as gap layers.

Adjustment of Strength of Magnetic Coupling (Intensity of Exchange-Coupling Magnetic Field)

Adjustment of the strength of a magnetic coupling (the intensity of an exchange-coupling magnetic field) is explained with reference to FIGS. 7 and 8.

Figure 7:
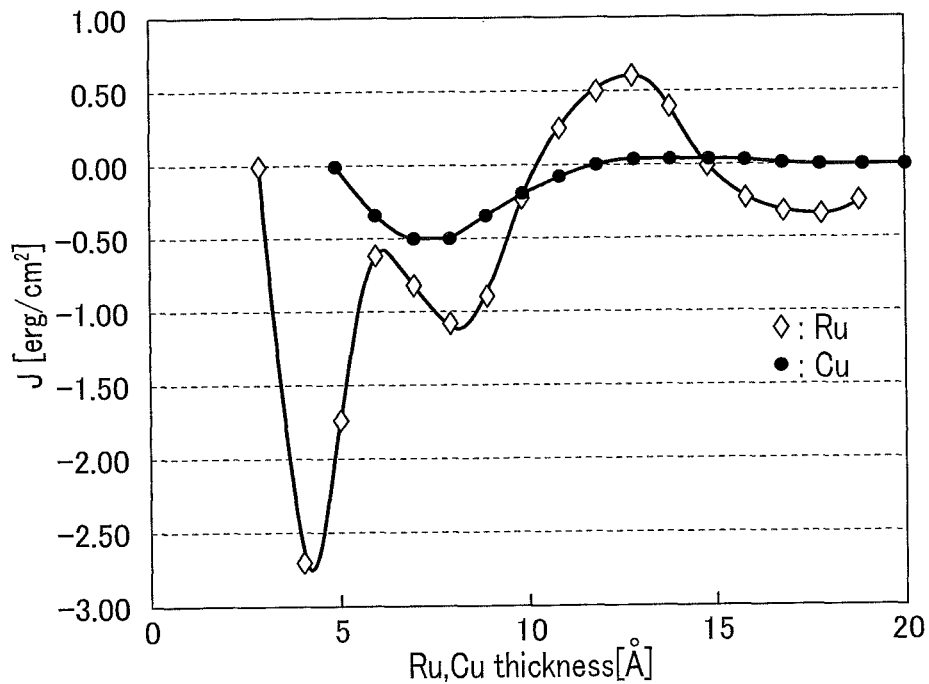
FIG. 7 is a graph illustrating a relation between a thickness t (Å (Angstrom)) of Ru or Cu and an exchange-coupling magnetic field intensity J (erg/cm$^2$) in a case where Ru or Cu is used as a constituent material of an exchange coupling transmitting layer and an exchange coupling adjustment layer of each of a first exchange coupling function gap layer and a second exchange coupling function gap layer in an embodiment of the present invention.

FIG. 7 is a graph illustrating a relation between a thickness t (Å (Angstrom)) of Ru or Cu and an exchange-coupling magnetic field intensity J (erg/cm$^2$) in a case where Ru or Cu is used as a constituent material of the exchange coupling transmitting layers 231, 241 and the exchange coupling adjustment layers 233, 243 in the first exchange coupling function gap layer 23 and the second exchange coupling function gap layer 24 are illustrated in FIG. 5. In this graph, a Co$_{90}$Fe$_{10}$ alloy is used a magnetic material that sandwiches Ru or Cu and is exchange-coupled. FIG. 8 is a graph illustrating a relation between the thickness t (Å (Angstrom)) of Cu and the exchange-coupling magnetic field intensity J (erg/cm$^2$). Basically, the graph is substantially the same as the graph related to Cu in FIG. 7. In particular, the graph is presented in a manner that the scale span of the exchange-coupling magnetic field intensity J (erg/cm$^2$) shown on the vertical axis is enlarged to facilitate understanding of variation along the vertical axis.

Figure 8:
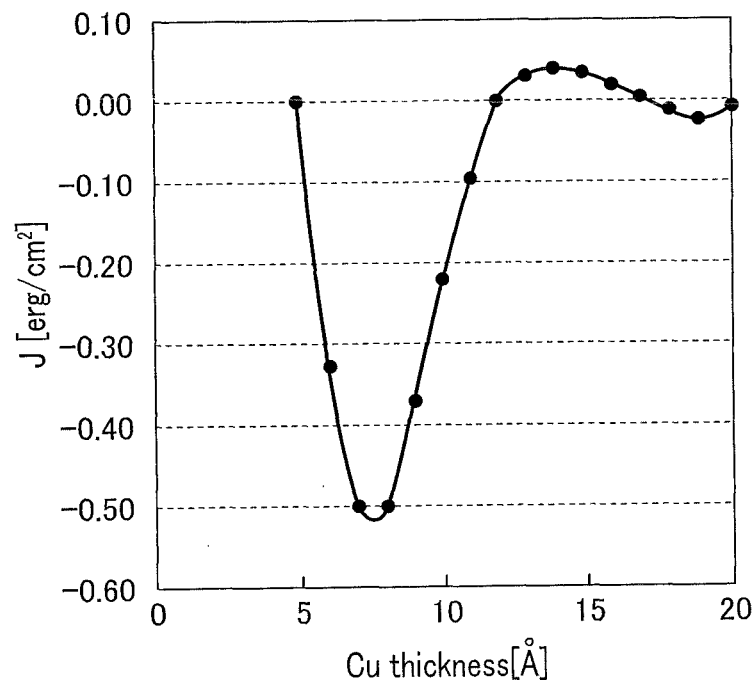
FIG. 8 is a graph illustrating the relation between the thickness t (Å (Angstrom)) of Cu and the exchange-coupling magnetic field intensity J (erg/cm$^2$) in the graph illustrated in FIG. 7.

In the graphs of FIGS. 7 and 8, when the value of the exchange-coupling magnetic field intensity J (erg/cm$^2$) is positive (+), the so-called ferromagnetic coupling (magnetic coupling in which magnetizations are mutually oriented in the same direction) occurs. On the other hand, when the value of the exchange-coupling magnetic field intensity J (erg/cm$^2$) is negative (−), the so-called antiferromagnetic coupling (magnetic coupling in which magnetizations are mutually oriented in the opposite directions) occurs. The absolute value |J| of the exchange-coupling magnetic field intensity J (erg/cm$^2$) represents an absolute amount of the coupling strength.

It is preferable that the exchange coupling transmitting layers 231, 241 are designed in a manner that the absolute value |J| of the exchange-coupling magnetic field intensity J (erg/cm$^2$) exceeds 0.2 (erg/cm$^2$) (|J|>0.2 (erg/cm$^2$)). When the absolute value |J| of the exchange-coupling magnetic field intensity J (erg/cm$^2$) is 0.2 (erg/cm$^2$) or less, there is a risk that the magnetizations of the gap adjustment layers 232, 242 may vary under an influence of a magnetic field from a medium so that the gap adjustment layers 232, 242 may function as a shield.

From such a point of view, in the present embodiment, as is clear from the graphs illustrated in FIGS. 7 and 8, when Cu is used as the material that forms the exchange coupling transmitting layers 231, 241, it is preferable that the thicknesses of the exchange coupling transmitting layers 231, 241 are set to be a range of 6 to 10 Å; and when Ru is used, it is preferable that the thicknesses of the exchange coupling transmitting layers 231, 241 are set to be a range of 4 to 9 Å or 16 to 20 Å.

On the other hand, it is preferable that the exchange coupling adjustment layers 233, 243 are designed in a manner that the absolute value |J| of the exchange-coupling magnetic field intensity J (erg/cm$^2$) is greater than 0.02 (erg/cm$^2$) and less than 0.6 (erg/cm$^2$) (0.02 erg/cm$^2$<|J|<0.6 erg/cm$^2$). When the absolute value |J| of the exchange-coupling magnetic field intensity J (erg/cm$^2$) is 0.02 (erg/cm$^2$) or less, there is a risk that the magnetization states of the first ferromagnetic layer 21 and the second ferromagnetic layer 22 that function as the so-called free layers may involve multiple magnetic domains and Barkhausen noise may be generated. On the other hand, when the absolute value |J| of the exchange-coupling magnetic field intensity J (erg/cm$^2$) is 0.6 (erg/cm$^2$) or more, there is a risk that it may be difficult for the magnetizations of the first ferromagnetic layer 21 and the second ferromagnetic layer 22 that function as the so-called free layers to freely respond to a signal magnetic field from a medium, which may lead to a low sensitivity.

From such a point of view, in the present embodiment, as is clear from the graphs illustrated in FIGS. 7 and 8, when Cu is used as the material that forms the exchange coupling adjustment layers 233, 243, it is preferable that the thicknesses of the exchange coupling adjustment layers 233, 243 are set to be a range of 13 to 16 Å; and when Ru is used, it is preferable that the thicknesses of the exchange coupling adjustment layers 233, 243 are set to be a range of 9.5 to 20 Å.

Even when Rh, Ir, Cu, Ag, Au, Pt or Pd is used as a constituent material of the exchange coupling transmitting layers 231, 241 and the exchange coupling adjustment layer 233, 243, the thicknesses of theses layers can be set in a way similar to that of Ru or Cu.

First Antiferromagnetic Layer and Second Antiferromagnetic Layer

The first antiferromagnetic layer 5 and the second antiferromagnetic layer 6 that are respectively formed adjacent to the upper shield layer 3 and the lower shield layer 4 perform a function of pinning the directions of the magnetizations of the upper shield layer 3 and the lower shield layer 4 by respectively exchange-coupling with the upper shield layer 3 and the lower shield layer 4.

As a material that forms the first antiferromagnetic layer 5 and the second antiferromagnetic layer 6, for example, an antiferromagnetic material that contains Mn and at least one element selected from a group including Pt, Ru, Rh, Pd, Ni, Cu, Ir, Cr and Fe can be used. It is preferable that the content of Mn in the antiferromagnetic material is 35 to 95 atom %.

The first antiferromagnetic layer 5 is configured to have a blocking temperature ($Tb_5$) lower than a blocking temperature ($Tb_6$) of the second antiferromagnetic layer 6. By letting the blocking temperatures of the first antiferromagnetic layer 5 and the second antiferromagnetic layer 6 to have such a relation ($Tb_5<Tb_6$) and manufacturing the magnetoresistive effect element 1 by using a method to be described later, the magnetizations 3a, 4a of the upper shield layer 3 and the lower shield layer 4 can be pinned in a mutually substantially orthogonal state.

For example, by making the thickness (in the Z-direction) of the first antiferromagnetic layer 5 less than the thickness (in the Z-direction) of the second antiferromagnetic layer 6, the blocking temperature ($Tb_5$) of the first antiferromagnetic layer 5 can be made lower than the blocking temperature ($Tb_6$) of the second antiferromagnetic layer 6. Preferably, the thickness of the first antiferromagnetic layer 5 can be set to be a range of 40 to 90 Å and the thickness of the second antiferromagnetic layer 6 can be set to be a range of 100 to 150 Å.

Among types of antiferromagnetic materials, there are a non-heat treatment type antiferromagnetic material that exhibits antiferromagnetism without the need of a heat treatment to induce an exchange-coupling magnetic field between it and a ferromagnetic material, and a heat treatment type antiferromagnetic material that exhibits antiferromagnetism by a heat treatment. In the present embodiment, as the material that forms the first antiferromagnetic layer 5 and the second antiferromagnetic layer 6, an antiferromagnetic material of any type may be used. Examples of the non-heat treatment type antiferromagnetic material include RuRhMn, FeMn, IrMn and the like, and examples of the heat treatment type antiferromagnetic material include PtMn, NiMn, PtRhMn and the like.

[Detection Operation of External Magnetic Field of Magnetoresistive Effect Element]

Figure 9A:
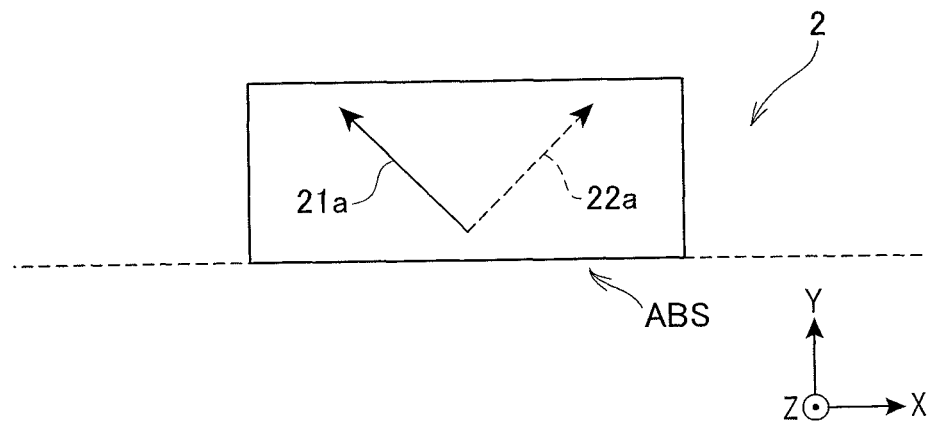
FIGS. 9A, 9B and 9C are model diagrams illustrating changes of a state of magnetization, in response to external magnetic fields, due to the magnetoresistive effect in a magnetoresistive effect element according to an embodiment of the present invention.
Figure 9B:
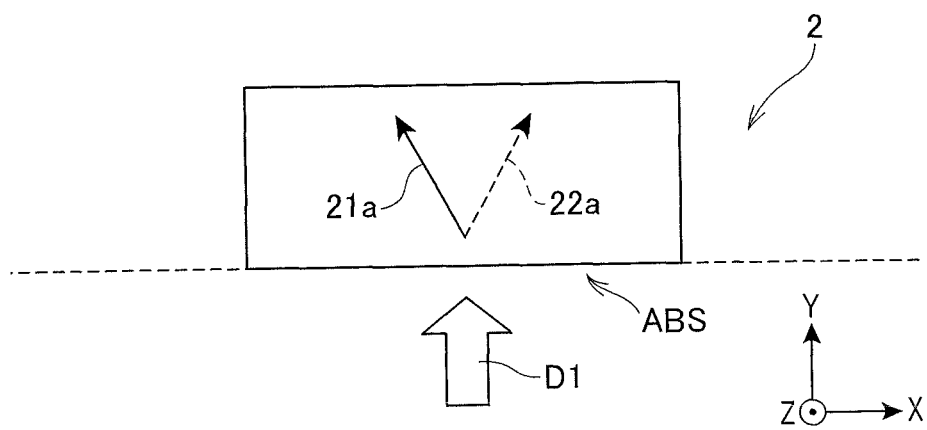
Figure 9C:
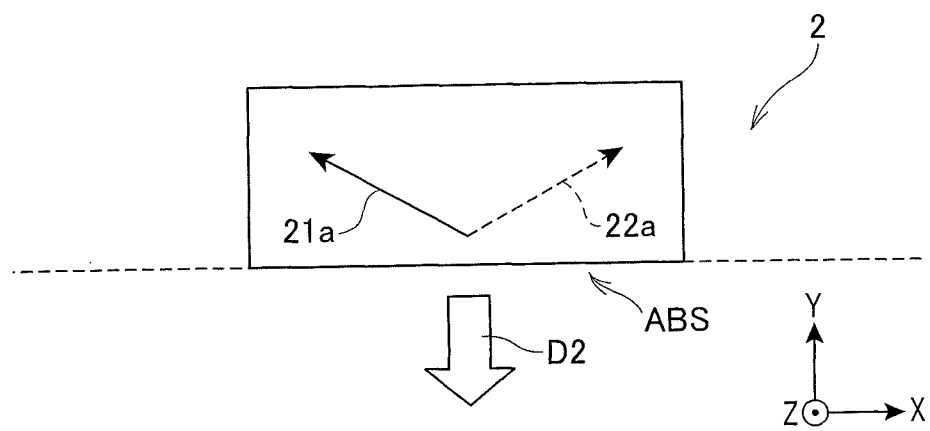

Referring to FIGS. 9A-9C, a detection operation of an external magnetic field by the magnetoresistive effect element 1 according to the present embodiment is explained.

As described above, the first ferromagnetic layer 21 and the second ferromagnetic layer 22 are respectively indirectly magnetically coupled with the upper shield layer 3 and the lower shield layer 4 in which the magnetizations 3a, 4a are mutually substantially orthogonal. Thereby, the magnetizations 21a, 22a of the first ferromagnetic layer 21 and the second ferromagnetic layer 22 are mutually substantially orthogonal (see FIG. 9A). This state is an initial state of the magnetoresistive effect element 1 (MR part 2).

As illustrated in FIG. 9B, when an external magnetic field D1 flowing in to the element from the ABS is detected, the magnetization 21a of the first ferromagnetic layer 21 and the magnetization 22a of the second ferromagnetic layer 22 tend to orient toward the same direction and the resistance of the element decreases.

On the other hand, as illustrated in FIG. 9C, when an external magnetic field D2 in a direction away from the ABS is detected, the magnetization 21a of the first ferromagnetic layer 21 and the magnetization 22a of the second ferromagnetic layer 22 tend to orient toward mutually opposite directions and the resistance of the element increases.

By measuring such a series of resistance changes with respect to the external magnetic field, the external magnetic field can be detected.

[Manufacturing Method of Magnetoresistive Effect Element]

A manufacturing method of the magnetoresistive effect element 1 having the above-described configuration is explained with reference to the drawings.

FIGS. 10A-10D are perspective views schematically illustrating a manufacturing process of a magnetoresistive effect element according to the present embodiment. FIGS. 11A-11D are perspective views schematically illustrating a first annealing treatment process and a second annealing treatment process in the manufacturing process of the magnetoresistive effect element according to the present embodiment.

Figure 10A:
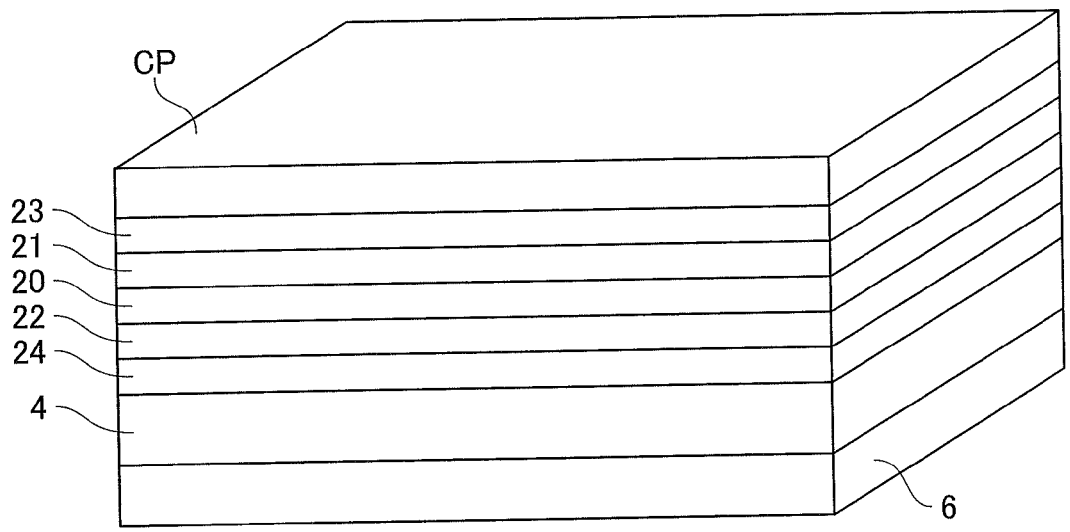
FIGS. 10A, 10B, 10C and 10D are perspective views schematically illustrating a process manufacturing a magnetoresistive effect element according to an embodiment of the present invention.
Figure 10A:
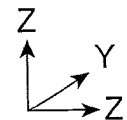
Figure 10B:
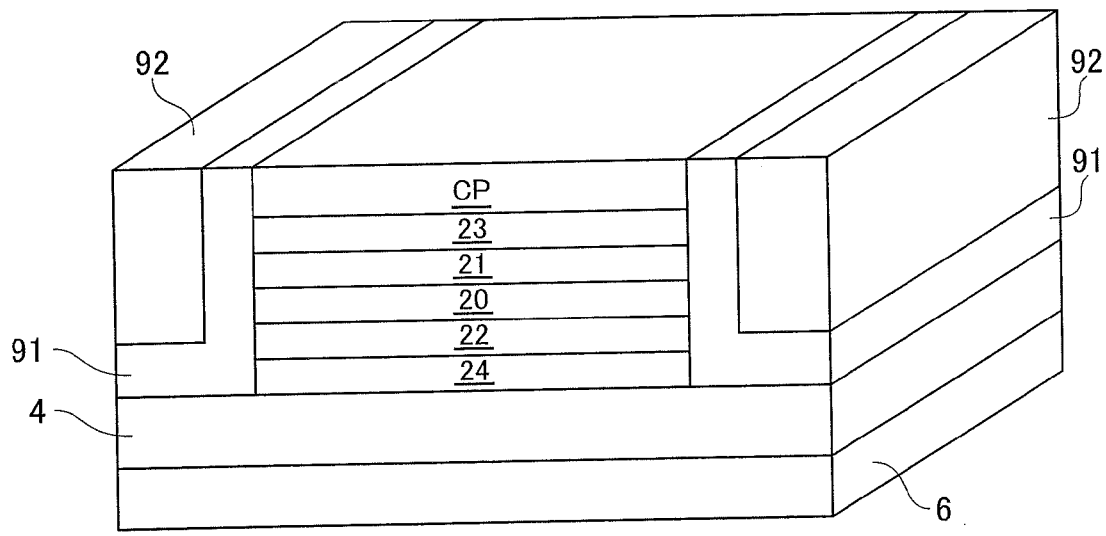
Figure 10B:
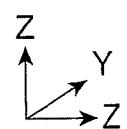
Figure 10C:
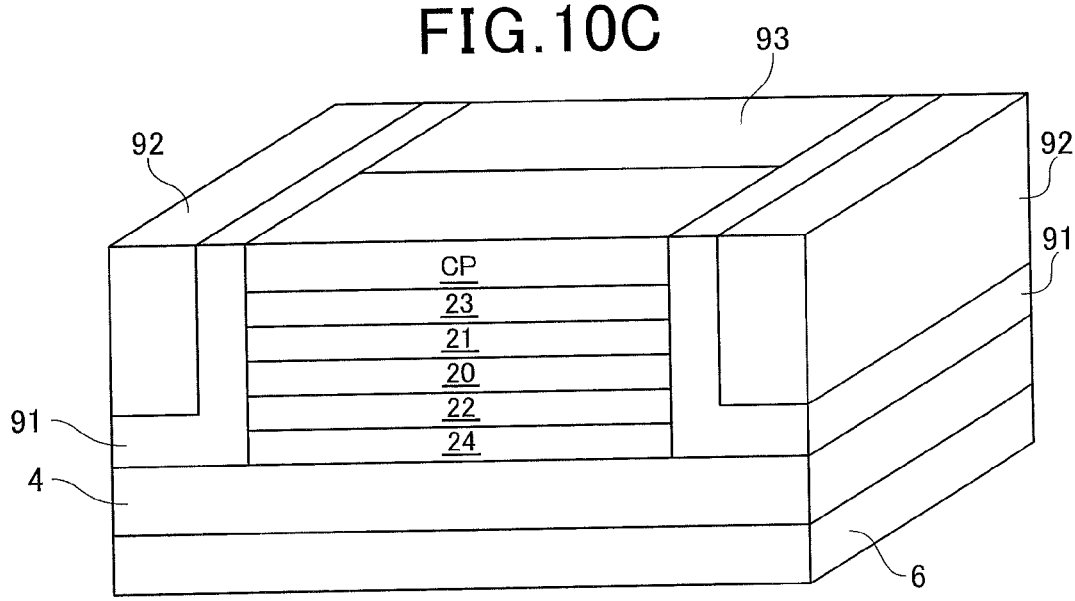
Figure 10D:
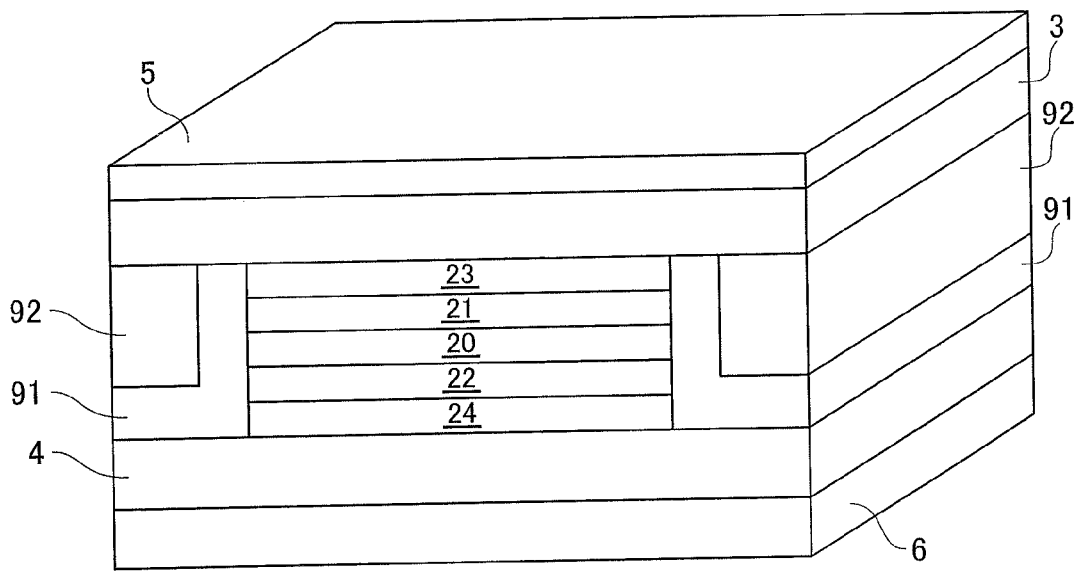

First, on the second antiferromagnetic layer 6, the lower shield layer 4, the second exchange coupling function gap layer 24, the second ferromagnetic layer 22, the nonmagnetic intermediate layer 20, the first ferromagnetic layer 21, the first exchange coupling function gap layer 23 and a TMR cap layer CP are laminated and formed in this order (see FIG. 10A). These layers (layers from the second antiferromagnetic layer 6 to the TMR cap layer CP) can be respectively formed by using, for example, a pattern plating method including a frame plating method, a sputtering method and the like.

Figure 11A:
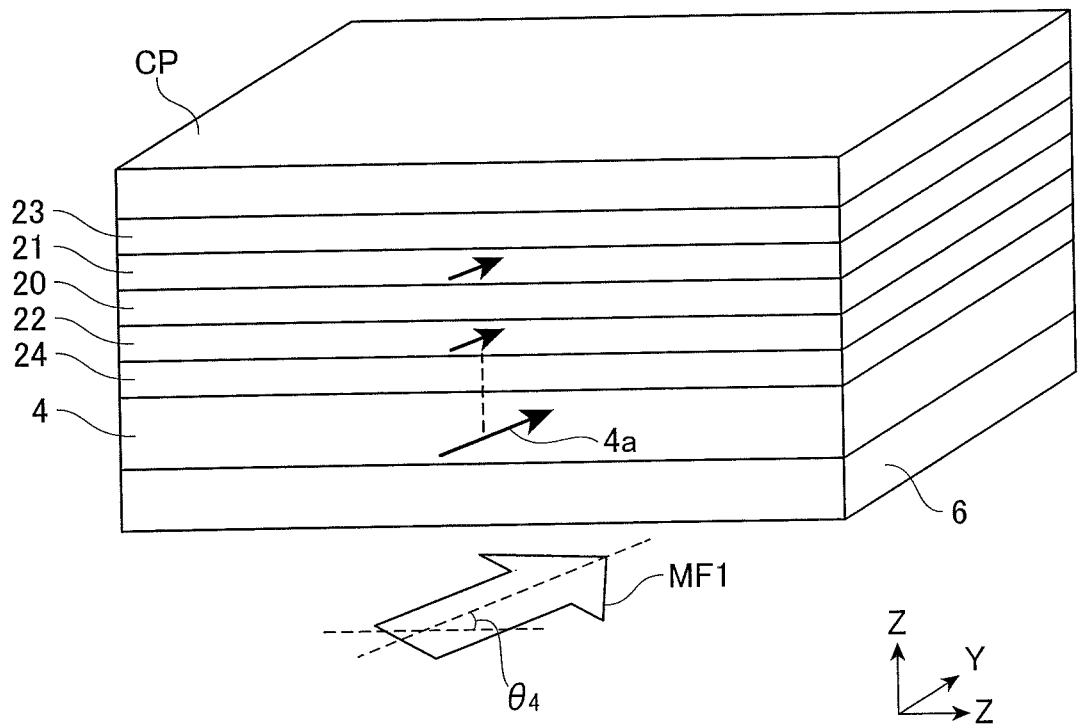
FIGS. 11A, 11B, 11C and 11D are perspective views schematically illustrating annealing treatment processes (a first annealing treatment process and a second annealing treatment process) in a process manufacturing a magnetoresistive effect element according to an embodiment of the present invention.
Figure 11B:
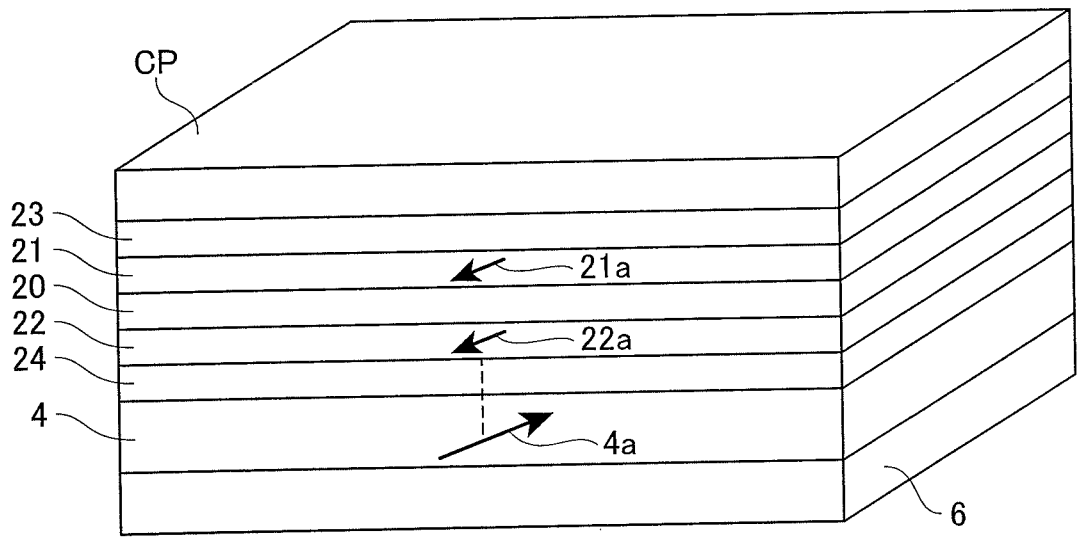

Next, while subjecting the so-formed multilayer body (the multilayer body illustrated in FIG. 10A) to an annealing treatment, a magnetic field MF1 is applied to the multilayer body in a predetermined direction (a direction having a predetermined angle $\theta_4$ (about 30-60 degrees, preferably about 45 degrees) with respect to the track width direction) (first annealing treatment; see FIG. 11A). In the example illustrated in FIG. 11A, the magnetic field MF1 is applied in a direction that is a direction oriented from front left toward back right and forms an angle of about 45 degrees with respect to the ABS.

In this case, an annealing temperature T1 is a temperature higher than the blocking temperature ($Tb_6$) of the second antiferromagnetic layer 6 ($T1>Tb_6$). By having the annealing temperature T1 to be a temperature higher than the blocking temperature ($Tb_6$) of the second antiferromagnetic layer 6, the magnetization 4a of the lower shield layer 4 on top of the second antiferromagnetic layer 6 can be oriented in the direction of the magnetic field MF1. On the other hand, as long as the annealing temperature T1 is a temperature higher than the blocking temperature ($Tb_6$) of the second antiferromagnetic layer 6, an upper limit of the annealing temperature T1 can be appropriately set according to the constituent material and the like of the respective layers (in particular, the lower shield layer 4). However, it is preferable that the annealing temperature T1 is lower than 300° C. In a case where NiFe is used as the material that forms the lower shield layer 4, when the annealing temperature T1 exceeds 300° C., there is a risk that roughness of the lower shield layer 4 may deteriorate.

In the first annealing treatment, the intensity of the magnetic field MF1 applied to the above-mentioned multilayer body (the multilayer body illustrated in FIG. 10A) is not particularly limited as long as the magnetic field MF1 is a sufficient magnetic field to saturate the magnetization 4a of the lower shield layer 4 in the direction of the magnetic field MF1. For example, the magnetic field MF1 can be set to be about 3 kOe.

In this way, when the magnetic field MF1 is applied while the annealing treatment is performed and the magnetization 4a of the lower shield layer 4 is saturated in the direction of the magnetic field MF1, the magnetizations 21a, 22a of the first ferromagnetic layer 21 and the second ferromagnetic layer 22 are also oriented in the direction of the magnetic field MF1. Then, when the temperature of the multilayer body (the multilayer body illustrated in FIG. 10A) is lowered to be equal to or lower than the blocking temperature ($Tb_6$) of the second antiferromagnetic layer 6, the orientation of the magnetization 4a of the lower shield layer 4 is pinned to the direction of the magnetic field MF1. Further, the second ferromagnetic layer 22 that indirectly magnetically couples with the lower shield layer 4 via the second exchange coupling function gap layer 24 is in a state in which the direction of the magnetization 22a of the second ferromagnetic layer 22 is antiparallel to the direction of the magnetization 4a of the lower shield layer 4 (see FIG. 11B).

Next, a photoresist film is formed to cover the TMR cap layer CP and patterning is performed. The remaining photoresist film is used as a mask to etch portions where the photoresist film does not exist (portions on two sides in the track width direction when viewed from the ABS) by using a dry etching method such as ion milling until the upper surface of the lower shield layer 4 is exposed. Thereafter, in the portion removed by etching, an insulation layer 91 made of $Al_2O_3$ and the like is formed by using, for example, a sputtering method, and a refill layer 92 made of Ru and the like is formed (see FIG. 10B). As a result, a track width of the MR part 2 is defined.

Next, a photoresist film is formed to cover the TMR cap layer CP, the insulation layer 91 and the refill layer 92 and patterning is performed. The remaining photoresist film is used as a mask to etch a portion where the photoresist film does not exist (a deeper portion than the ABS in the multilayer body including layers from the second exchange coupling function gap layer 24 to the TMR cap layer CP) by using a dry etching method such as ion milling until the upper surface of the lower shield layer 4 is exposed. Thereafter, in the portion removed by etching, an insulation layer 93 made of $Al_2O_3$ and the like is formed (see FIG. 10C). As a result, a height (MR height (MR-h)) of the MR part 2 in the direction (Y-direction) perpendicular to the ABS is defined.

Thereafter, planarization is performed by using a polishing method such chemical mechanical polishing (CMP) to expose the upper surface of the first exchange coupling function gap layer 23. On top of the first exchange coupling function gap layer 23, the upper shield layer 3 and the first antiferromagnetic layer 5 are laminated and formed in this order (see FIG. 10D).

Figure 11C:
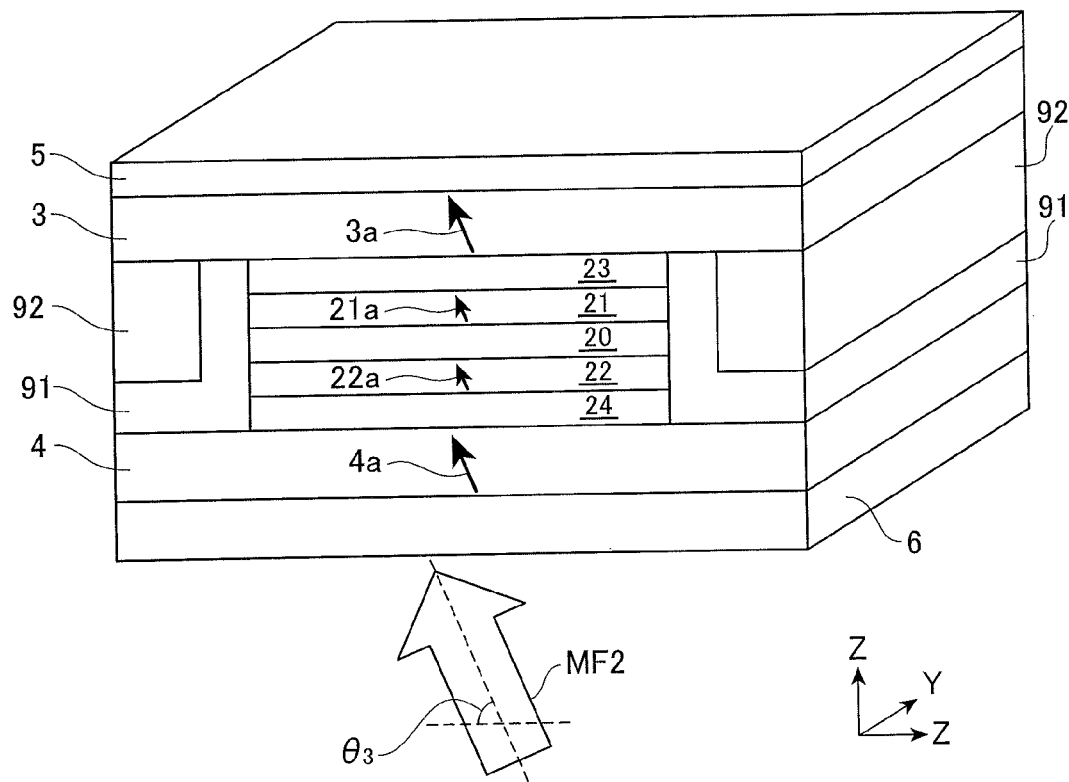
Figure 11D:
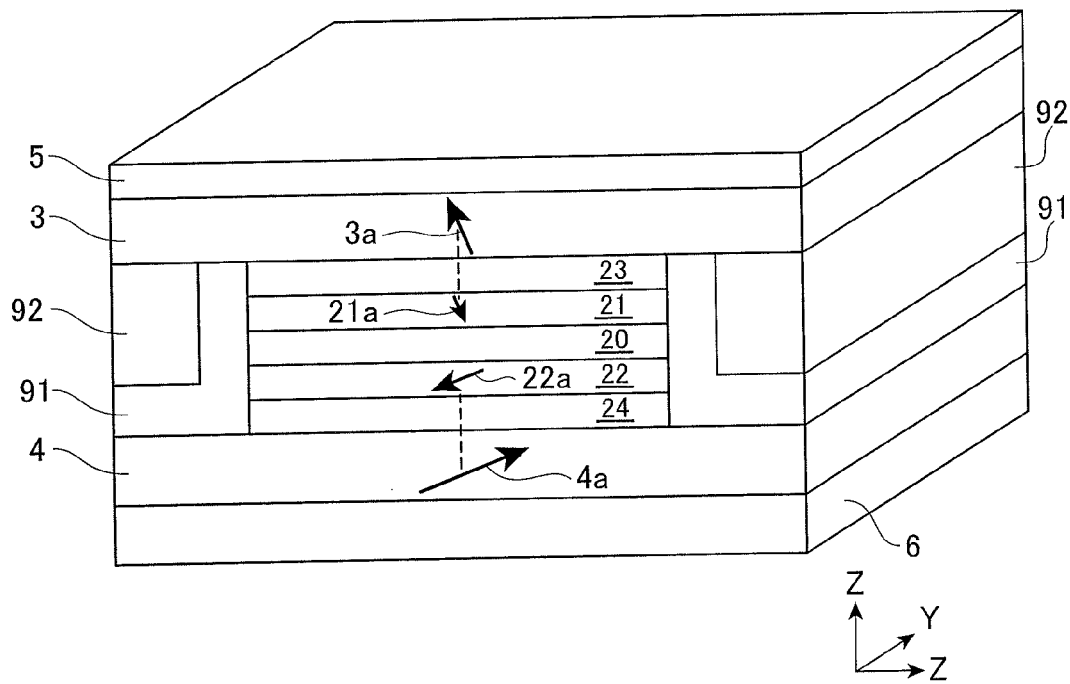

While subjecting the so-formed multilayer body (the multilayer body illustrated in FIG. 10D) to an annealing treatment, a magnetic field MF2 is applied in a predetermined direction (a direction that forms a predetermined angle $\theta_3$ (about 30-60 degrees, preferably about 45 degrees) with respect to the track width direction and is substantially orthogonal to the direction of the magnetization 4a of the lower shield layer 4) (second annealing treatment; see FIG. 11C). In the example illustrated in FIG. 11C, the magnetic field MF2 is applied in a direction that is a direction oriented from front right toward back left and forms an angle of about 45 degrees with respect to the ABS.

In this case, an annealing temperature T2 can be set to be a temperature lower than the blocking temperature ($Tb_6$) of the second antiferromagnetic layer 6 and higher than the blocking temperature ($Tb_5$) of the first antiferromagnetic layer 5 ($Tb_5<T2<Tb_6$). By having the annealing temperature T2 to be a temperature higher than the blocking temperature ($Tb_5$) of the first antiferromagnetic layer 5, the magnetization 3a of the upper shield layer 3 below the first antiferromagnetic layer 5 can be oriented in the direction of the magnetic field MF2. On the other hand, when the annealing temperature T2 exceeds the blocking temperature ($Tb_6$) of the second antiferromagnetic layer 6, there is a risk that the magnetization direction of the lower shield layer 4 that is pinned to the direction of the predetermined angle $\theta_4$ by the above-described first annealing treatment may be pinned to the direction of the magnetic field MF2 in the second annealing treatment so that it may be not possible for the directions of the magnetizations 3a, 4a of the upper shield layer 3 and the lower shield layer 4 to be mutually substantially orthogonal. Therefore, by having the annealing temperature T2 to be lower than the blocking temperature ($Tb_6$) of the second antiferromagnetic layer 6, the direction of the magnetization 4a of the lower shield layer 4 after the second annealing treatment can remain being pinned to the direction of the predetermined angle $\theta_4$.

In the second annealing treatment, the intensity of the magnetic field MF2 applied to the above-mentioned multilayer body (the multilayer body illustrated in FIG. 10D) is not particularly limited as long as the magnetic field MF2 is a sufficient magnetic field to saturate the magnetization 3a of the upper shield layer 3 in the direction of the magnetic field MF2. For example, the magnetic field MF2 can be set to be about 3 kOe.

In this way, when the magnetic field MF2 is applied while the second annealing treatment is performed and the magnetization 3a of the upper shield layer 3 is saturated in the direction of the magnetic field MF2, the magnetizations 21a, 22a, 4a of the first ferromagnetic layer 21, the second ferromagnetic layer 22 and the lower shield layer 4 are also oriented in the direction of the magnetic field MF2 (see FIG. 11C). Then, when the temperature of the multilayer body (the multilayer body illustrated in FIG. 10D) is lowered to be equal to or lower than the blocking temperature ($Tb_5$) of the first antiferromagnetic layer 5, the orientation of the magnetization 3a of the upper shield layer 3 is pinned to the direction of the magnetic field MF2. At the same time, the first ferromagnetic layer 21 that indirectly magnetically couples with the upper shield layer 3 via the first exchange coupling function gap layer 23 is in a state in which the direction of the magnetization 21a of the first ferromagnetic layer 21 is antiparallel to the direction of the magnetization 3a of the upper shield layer 3.

In this way, before the upper shield layer 3 is formed, by the first annealing treatment in which heating is performed while the magnetic field MF1 is applied in the direction of the predetermined angle $\theta_4$, the direction of the magnetization 4a of the lower shield layer 4 can be pinned to the direction of the predetermined angle $\theta_4$. Thereafter, the upper shield layer 3 is formed, and by the second annealing treatment in which heating is performed while the magnetic field MF2 is applied in the direction of the predetermined angle $\theta_3$, the direction of the magnetization 3a of the upper shield layer 3 can be pinned to the direction of the predetermined angle $\theta_3$. By having the annealing temperature T2 in the second annealing treatment to be lower than the blocking temperature ($Tb_6$) of the second antiferromagnetic layer 6 that pins the magnetization 4a of the lower shield layer 4, the direction of the magnetization 4a of the lower shield layer 4 after the second annealing treatment remains as the direction that is pinned by the first annealing treatment. Therefore, the magnetizations 3a, 4a of the upper shield layer 3 and the lower shield layer 4 can be mutually substantially orthogonal. Then, by being respectively indirectly magnetically coupled with the upper shield layer 3 and the lower shield layer 4, the first ferromagnetic layer 21 and the second ferromagnetic layer 22 are in a state in which the magnetizations 21a, 22a of the first ferromagnetic layer 21 and the second ferromagnetic layer 22 are respectively antiparallel to the magnetizations 3a, 4a of the upper shield layer 3 and the lower shield layer 4. As a result, the magnetizations 21a, 22a of the first ferromagnetic layer 21 and the second ferromagnetic layer 22 can be in a mutually substantially orthogonal state.

According to the so-manufactured magnetoresistive effect element 1 of the present embodiment, even when a bias magnetic field application part (such as a permanent magnet) that applies a bias magnetic field to the first ferromagnetic layer 21 and the second ferromagnetic layer 22 does not exist, the magnetizations 21a, 22a of the first ferromagnetic layer 21 and the second ferromagnetic layer 22 can be in a mutually substantially orthogonal state, that is, the initial state.

[Thin Film Magnetic Head]

Figure 12:
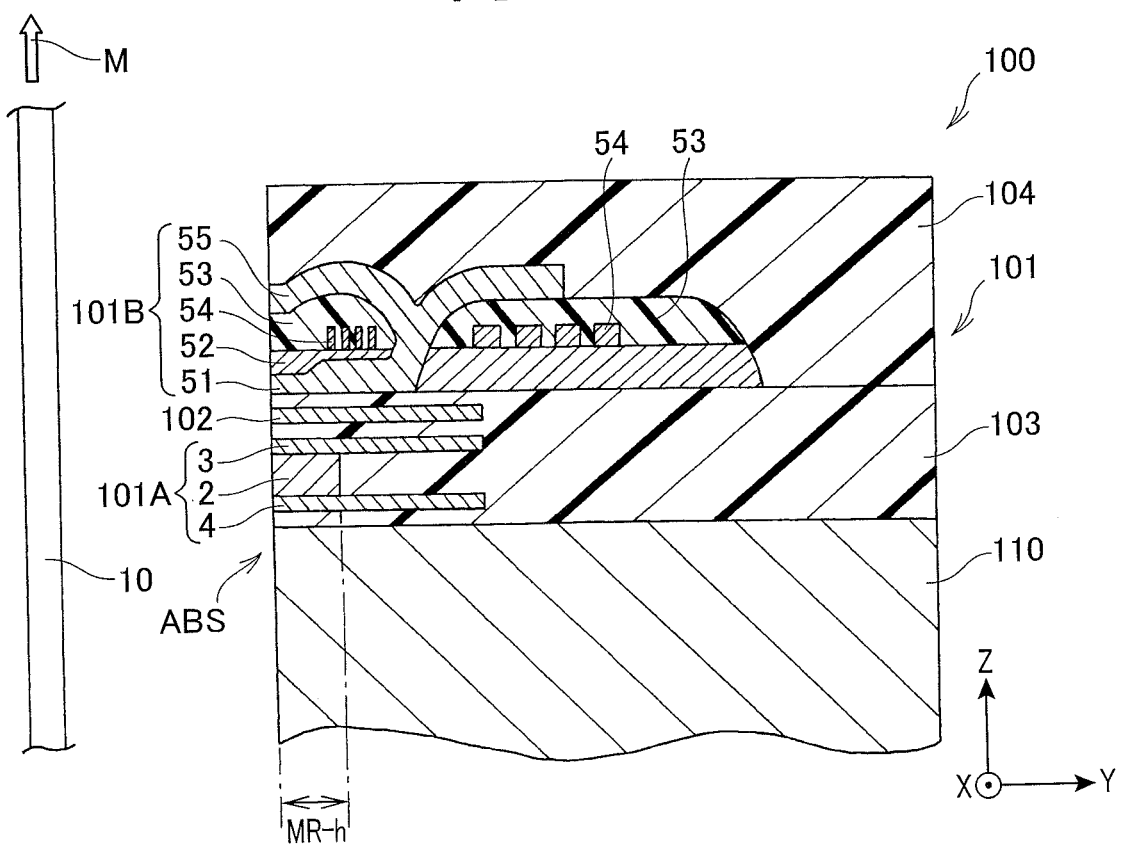
FIG. 12 is a cross-sectional view in a plane orthogonal to an ABS schematically illustrating a configuration of a thin film magnetic head in an embodiment of the present invention.

Next, an overall structure of a thin film magnetic head according to the present embodiment is explained with reference to FIG. 12. FIG. 12 is a cross-sectional view of a thin film magnetic head according to the present embodiment in a plane orthogonal to the ABS (cross-sectional view in a YZ plane).

As illustrated in FIG. 12, a thin film magnetic head 100 is mounted and used in a magnetic recording apparatus such as a hard disk drive for performing magnetic processing to a recording medium 10 such as a hard disk that moves in a medium traveling direction M.

The thin film magnetic head 100 illustrated in FIG. 12 is a so-called composite type head that is capable of performing both recording processing and reproducing processing as the magnetic processing.

The thin film magnetic head 100 is formed by forming a magnetic head part 101 on a slider substrate 110 that is made of a ceramic material such as ALTIC ($Al_2O_3$—TiC).

The magnetic head part 101 has a configuration in which a reproducing head part 101A that performs reproducing processing of recorded magnetic information by using the MR effect and a shield type recording head part 101B that performs recording processing of a perpendicular recording system are laminated in this order.

The reproducing head part 101A is configured by the magnetoresistive effect element 1 (see FIGS. 1-6) according to the present embodiment that has the lamination structure in which the lower shield layer 4, the MR part 2 and the upper shield layer 3 are laminated in this order. The lower shield layer 4, the MR part 2 and the upper shield layer 3 form a portion of the ABS. The height of the MR part 2 in the direction (Y-direction) perpendicular to the ABS is the MR height (MR-h).

Between the upper shield layer 3 and the recording head part 101B, an interelement shield layer 102 made of the same material as the upper shield layer 3 is formed.

The interelement shield layer 102 plays a role of shielding the MR part 2 that functions as a sensor from a magnetic field generated by the recording head part 101B to prevent exogenous noise during reading. Further, a bucking coil part may also be formed between the interelement shield layer 102 and the recording head part 101B. The bucking coil part generates magnetic flux that cancels out a magnetic flux loop that is generated from the recording head part 101B and passes through upper and lower electrode layers of the MR part 2, and acts to inhibit unwanted writing to the recording medium 10 or a wide area adjacent tracks erasure (WATE) phenomenon that is an erasing operation.

An insulation layer 103 made of alumina and the like is formed in all of a gap between the upper shield layer 3 and the lower shield layer 4 on a side opposite to the ABS of the MR part 2, a back region on a side opposite to the ABS of the upper shield layer 3, the lower shield layer 4 and the interelement shield layer 102, a gap between the lower shield layer 4 and the slider substrate 110, and a gap between the interelement shield layer 102 and the recording head part 101B.

It is preferable that the recording head part 101B is configured for perpendicular magnetic recording. As illustrated in FIG. 12, the recording head part 101B has a main magnetic pole layer 51, a gap layer 52, a coil insulation layer 53, a coil layer 54 and an auxiliary magnetic pole layer 55.

The main magnetic pole layer 51 is configured as magnetic guide for guiding and focusing magnetic flux induced by the coil layer 54 to a recording layer of the recording medium 10 where writing is performed. Here, it is preferable that at an end part of the main magnetic pole layer 51 on the ABS side, a width in the track width direction (X-direction in FIG. 12) and a thickness in the lamination direction (Z-direction in FIG. 12) are set smaller as compared to those of other portions. This allows a fine and strong magnetic field for writing that corresponds to a high recording density to be generated.

An end part on the ABS side of the auxiliary magnetic pole layer 55 that magnetically couples with the main magnetic pole layer 51 forms a trailing shield part that has a layer cross section wider than other portions of the auxiliary magnetic pole layer 55. As illustrated in FIG. 12, the auxiliary magnetic pole layer 55 is arranged opposing the end part of the main magnetic pole layer 51 on the ABS side with the gap layer 52 and the coil insulation layer 53 that are made of an insulating material such as alumina interposed therebetween.

By providing such an auxiliary magnetic pole layer 55, a steeper magnetic field gradient can be formed between the auxiliary magnetic pole layer 55 and the main magnetic pole layer 51 in the vicinity of the ABS. This allows jitter in signal output to be reduced and thus an error rate during reading to be reduced.

The auxiliary magnetic pole layer 55 is formed by, for example, a frame plating method, a sputtering method or the like to have a thickness of, for example, about 0.5-5 µm. Examples of a material that forms the auxiliary magnetic pole layer 55 include an alloy composed of two or three elements selected from Ni, Fe and Co, an alloy containing these elements as main components along with a predetermined element added.

The gap layer 52 is formed in a manner separating the coil layer 54 and the main magnetic pole layer 51. The gap layer 52 is formed by using, for example, a sputtering method, a CVD method, and the like, and is configured by $Al_2O_3$, DLC (diamond like carbon) and the like having a thickness of, for example, about 0.01-0.5 µm.

An insulation layer 104 made of alumina and the like is formed covering around the recording head part 101B.

[Head Gimbal Assembly and HDD Apparatus]

Next, a head gimbal assembly and a HDD apparatus, in which the thin film magnetic head 100 of the present embodiment is mounted and used, are explained.

Figure 13:
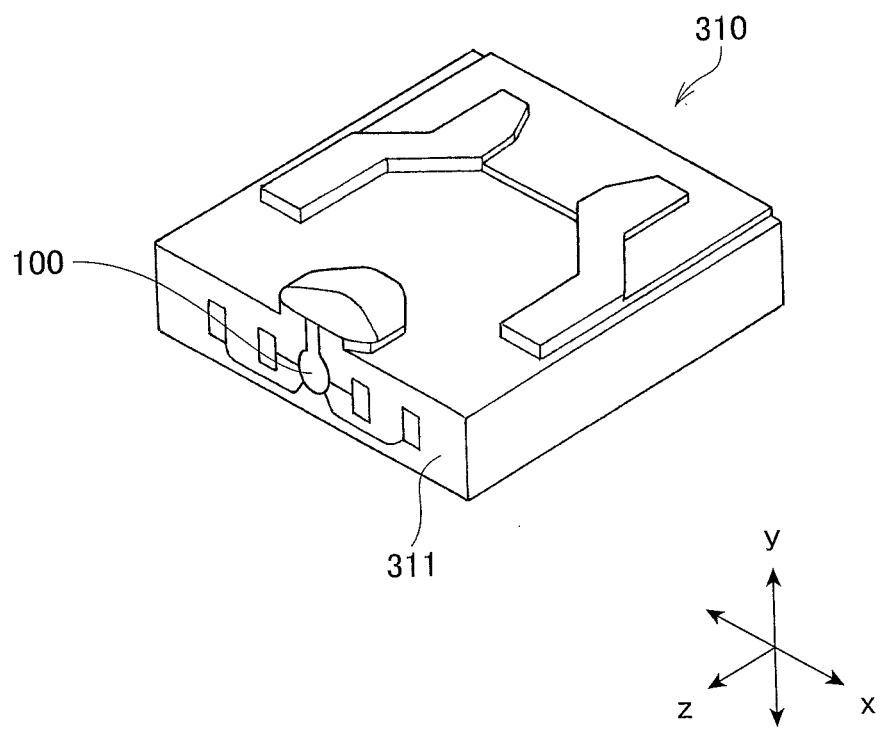
FIG. 13 is a perspective view illustrating a slider contained in a head gimbal assembly in an embodiment of the present invention.

First, referring to FIG. 13, a slider 310 contained in the head gimbal assembly is explained. In the HDD apparatus, the slider 310 is arranged in a manner opposing a hard disk that is a rotatably driven discotic recording medium. The slider 310 is provided with a base body 311 that is mainly configured by a substrate and a overcoat.

The base body 311 has a nearly hexahedral shape. One of the six surfaces of the base body 311 opposes the hard disk. An ABS is formed on this surface.

When the hard disk rotates in a z direction in FIG. 13, air flow passing through between the hard disk and the slider 310 generates a lifting force on the slider 310 downward in a y direction in FIG. 13. The slider 310 flies from the surface of the hard disk due to the lifting force. An x direction in FIG. 13 is a track width direction of the hard disk.

The thin film magnetic head 100 in the present embodiment is formed in the vicinity of an end part of the slider 310 on air outflow side (end part on the lower left side in FIG. 13).

Figure 14:
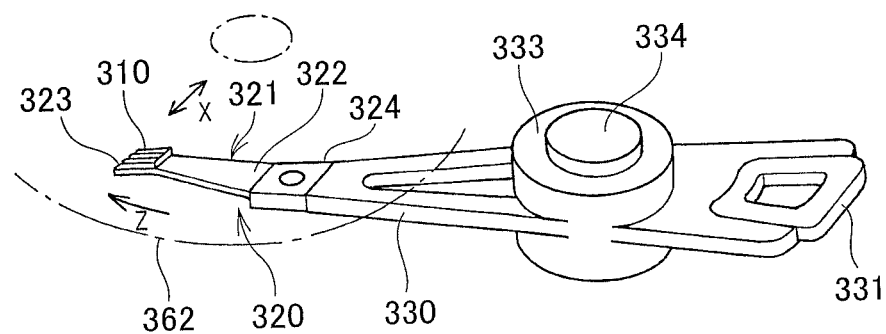
FIG. 14 is a perspective view illustrating a head arm assembly that contains head gimbal assembly in an embodiment of the present invention.

Next, referring to FIG. 14, a head gimbal assembly 320 in the present embodiment is explained. The head gimbal assembly 320 is provided with the slider 310 and a suspension 321 that elastically supports the slider 310. The suspension 321 has a load beam 322, a flexure 323, and a base plate 324. The load beam 322 is formed of, for example, stainless steel and has a shape of a plate spring. The flexure 323 is provided on one end part of the load beam 322 and is joined with the slider 310 to provide an appropriate degree of freedom to the slider 310. The base plate 324 is provided on the other end part of the load beam 322.

The base plate 324 is mounted on an arm 330 of an actuator for moving the slider 310 in a track crossing direction x of a hard disk 362. The actuator has the arm 330 and a voice coil motor that drives the arm 330. A gimbal part for keeping a posture of the slider 310 constant is provided on a portion of the flexure 323 on which the slider 310 is mounted.

The head gimbal assembly 320 is mounted on the arm 330 of the actuator. An assembly in which the head gimbal assembly 320 is mounted on an arm 330 is referred to as a head arm assembly. Further, an assembly in which the head gimbal assembly 320 is mounted on each arm of a carriage that has a plurality of arms is referred to as a head stack assembly.

FIG. 14 illustrates an example of a head arm assembly. In this head arm assembly, the head gimbal assembly 320 is mounted on one end part of the arm 330. On the other end part of the arm 330, a coil 331 that forms a part of the voice coil motor is mounted. In a middle portion of the arm 330, a bearing part 333 mounted on a shaft 334 for rotatably supporting the arm 330 is provided.

Figure 15:
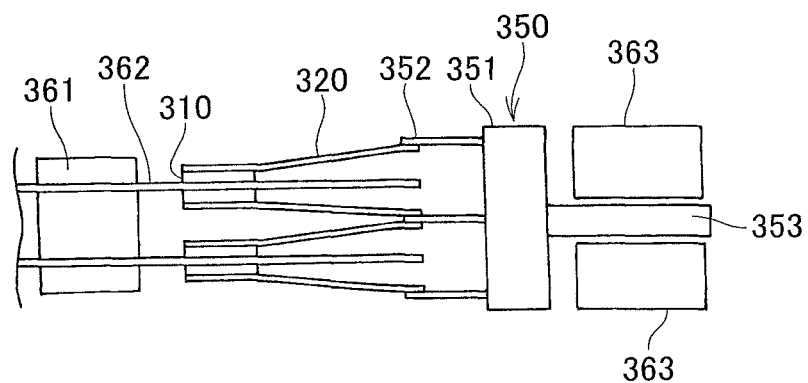
FIG. 15 is an explanatory diagram illustrating a main part of a HDD apparatus in an embodiment of the present invention.
Figure 16:
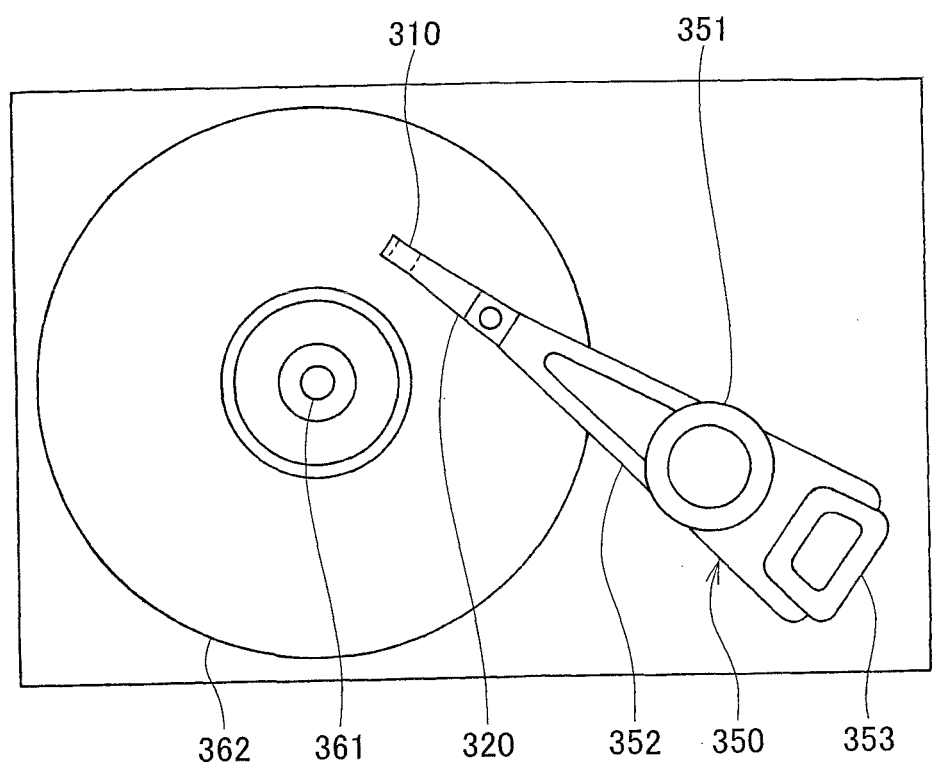
FIG. 16 is a plan view illustrating a HDD apparatus in an embodiment of the present invention.
Figure 17:
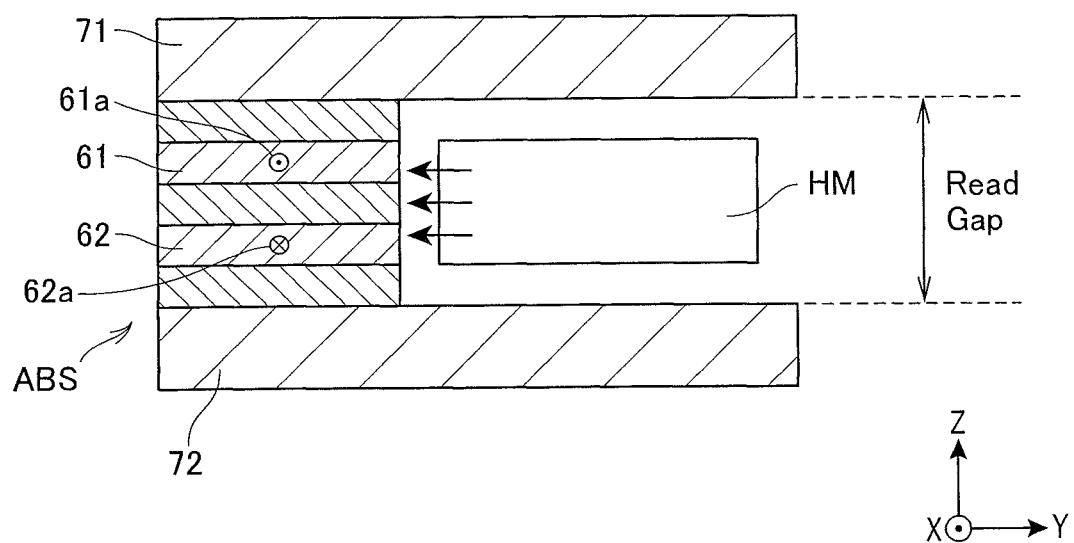
FIG. 17 is a cross-sectional view in a plane orthogonal to an ABS schematically illustrating a magnetoresistive effect element of a conventional technology.
Figure 18:
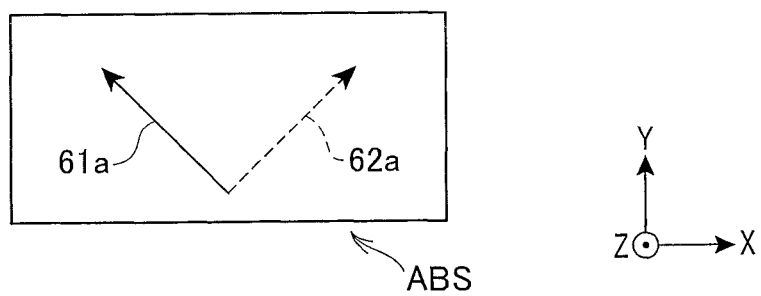
FIG. 18 is a model diagram illustrating an initial magnetization state in two ferromagnetic layers in a magnetoresistive effect element of a conventional technology.

Next, referring to FIGS. 15 and 16, an example of the head stack assembly, and the HDD apparatus in the present embodiment, are explained.

FIG. 15 is an explanatory diagram illustrating a main part of the HDD apparatus. FIG. 16 is a plan view of the HDD apparatus.

A head stack assembly 350 has a carriage 351 that has a plurality of arms 352. On the plurality of the arms 352, a plurality of the head gimbal assemblies 320 are mounted in a manner to align themselves in a perpendicular direction at intervals from each other. On an opposite side of the arms 352 of the carriage 351, the coil 353 that forms a part of the voice coil motor is mounted. The head stack assembly 350 is incorporated into the HDD apparatus.

The HDD apparatus has a plurality of the hard disks 362 mounted on a spindle motor 361. On each hard disk 362, two sliders 310 are arranged in a manner opposing each other across the hard disk 362. The voice coil motor has permanent magnets 363 arranged at positions opposing each other across the coil 353 of the head stack assembly 350.

The head stack assembly 350 and the actuator, excluding the slider 310, correspond to a positioning device in the present embodiment, support the slider 310 and position the slider 310 with respect to the hard disk 362.

In the HDD apparatus according to the present embodiment, the slider 310 is moved by the actuator in the track crossing direction of the hard disk 362 and is positioned with respect to the hard disk 362. The thin film magnetic head 100 (see FIG. 12) contained in the slider 310 uses the recording head part 101B (see FIG. 12) to record information to the hard disk 362 and uses the reproducing head part 101A (see FIG. 12) to reproduce the information recorded in the hard disk 362.

The embodiment explained above is described in order to facilitate understanding of the present invention and is not described in order to limit the present invention. Therefore, it is intended that each element disclosed in the above embodiment also includes all design modifications and equivalents that belong to the technical scope of the present invention.

In the above-described embodiment, the composite type thin film magnetic head having the reproducing head part 101A and the recording head part 101B that is laminated on the reproducing head part 101A is explained as an example. However, the present invention is not limited to this embodiment. For example, the composite type thin film magnetic head may also have the recording head part 101B and the reproducing head part 101A that is laminated on the recording head part 101B; that is, the lamination order may be reversed. Further, the magnetoresistive effect element 1 according to the above-described embodiment is also applicable to a reproduce-only thin film magnetic head that is provided with only the reproducing head part 101A without the recording head part 101B.

EXAMPLES

In the following, the present invention is explained in more detail by providing experimental examples. However, the present invention is not limited in any way by the experimental examples and the like described below.

Experimental Example 1

A magnetoresistive effect element (Example 1) having a configuration as illustrated in FIGS. 1, 2, 4A, 4B and 6 was fabricated.

That is, as illustrated in the following Table 1, on top of a second antiferromagnetic layer 6 that was made of IrMn, a lower shield layer 4 that was made of NiFe and had a thickness of 125 Å is formed. On top of this lower shield layer 4, an MR part 2 that had a lamination configuration as illustrated in Table 1 was formed. The thickness of the second antiferromagnetic layer 6 was 100 Å so that the blocking temperature ($Tb_6$) of the second antiferromagnetic layer 6 was 270° C.

Then, with respect to the multilayer body that included the second antiferromagnetic layer 6, the lower shield layer 4 and the MR part 2, a first annealing treatment (see FIG. 11A) was performed in which, while a magnetic field (3 kOe) was applied in a direction of a predetermined angle $\theta_4$, heating was performed at a temperature (280° C.) that was higher than the blocking temperature $Tb_6$ of the second antiferromagnetic layer 6.

Next, on top of the MR part 2, an upper shield layer 3 that was made of NiFe and had a thickness of 125 Å is formed. On top of the upper shield layer 3, a first antiferromagnetic layer 5 that was made of IrMr was formed. The thickness of the first antiferromagnetic layer 5 was 50 Å so that the blocking temperature ($Tb_5$) of the first antiferromagnetic layer 5 was 200° C.

Then, with respect to the multilayer body that included the second antiferromagnetic layer 6, the lower shield layer 4, the MR part 2, the upper shield layer 3 and the first antiferromagnetic layer 5, a second annealing treatment (see FIG. 11C) was performed in which, while a magnetic field (3 kOe) was applied in a direction of a predetermined angle $\theta_3$, heating was performed at a temperature (210° C.) that was higher than the blocking temperature $Tb_5$ of the first antiferromagnetic layer 5 and lower than the blocking temperature $Tb_6$ of the second antiferromagnetic layer 6.

Further, when viewed from an ABS side, an insulation layer made of $Al_2O_3$ was formed on both sides in a track width direction (X-direction) of the MR part 2.

The so-formed magnetoresistive effect element of Example 1 was used to detect a signal magnetic field from a medium that corresponds to a magnetic field in a range from −400 Oe to 400 Oe, and it was confirmed that a practically-usable magnetoresistive change was obtained.

annealing treatment was performed in which, while a magnetic field (3 kOe) was applied in a direction of a predetermined angle θ4, heating was performed at a temperature (280° C.) that was higher than the blocking temperature $Tb_6$ of the second antiferromagnetic layer 6.

Next, on top of the MR part 2, an upper shield layer 3 was formed in which a second upper shield layer 32 that was made of NiFe and had a thickness of 25 Å, an upper nonmagnetic layer 30 that was made of Ru, and a first upper shield layer 31 that was made of NiFe and has a thickness of 125 Å were

TABLE 1

| Lamination Structure | | | Constituent Material of Each Layer | Thickness (Å) |
|---|---|---|---|---|
| | First Antiferromagnetic Layer (5) | | IrMn | 50 |
| | Upper Shield Layer (3) | | NiFe | 125 |
| Magnetoresistive Effect Part (2) | First Exchange Coupling Function Gap Layer (23) | First Exchange Coupling Transmitting Layer (231A) | Ru | 8 |
| | | First Gap Adjustment Layer (232A) | CoFe | 10 |
| | | Second Exchange Coupling Transmitting Layer (231B) | Ru | 8 |
| | | Second Gap Adjustment Layer (232B) | CoFe | 10 |
| | | Exchange Coupling Adjustment Layer (233) | Cu | 9 |
| | Sensor Region | First Ferromagnetic Layer (21) | 90CoFe*[1] | 30 |
| | | Nonmagnetic Intermediate Layer (20) | Cu | 5 |
| | | | ZnO | 18 |
| | | | Cu | 5 |
| | | Second Ferromagnetic Layer (22) | 90CoFe*[1] | 30 |
| | Second Exchange Coupling Function Gap Layer (24) | Exchange Coupling Adjustment Layer (243) | Cu | 9 |
| | | First Gap Adjustment Layer (242A) | CoFe | 10 |
| | | First Exchange Coupling Transmitting Layer (241A) | Ru | 8 |
| | | Second Gap Adjustment Layer (242B) | CoFe | 10 |
| | | Second Exchange Coupling Transmitting Layer (241B) | Ru | 8 |
| | Lower Shield Layer (4) | | NiFe | 125 |
| Second Antiferromagnetic Layer (6) | | | IrMn | 100 |

*[1] In Table 1, "90CoFe" means a cobalt-iron alloy containing 90 atomic percent of cobalt.

Experimental Example 2

A magnetoresistive effect element (Example 2) having a configuration as illustrated in FIGS. 2, 3, 4A, 4B and 6 was fabricated.

That is, as illustrated in the following Table 2, on top of a second antiferromagnetic layer 6 that is made of IrMn, a lower shield layer 4 was formed in which a second lower shield layer 42 that was made of NiFe and had a thickness of 125 Å, a lower nonmagnetic layer 40 that was made of Ru and a first lower shield layer 41 that was made of NiFe and has a thickness of 125 Å were laminated in this order. On top of the lower shield layer 4 (on top of the first lower shield layer 41), an MR part 2 that had a lamination configuration as illustrated in Table 2 was formed. The thickness of the second antiferromagnetic layer 6 was 100 Å so that the blocking temperature ($Tb_6$) of the second antiferromagnetic layer 6 was 270° C.

Then, with respect to the multilayer body that included the second antiferromagnetic layer 6, the lower shield layer 4 (the second lower shield layer 42, the lower nonmagnetic layer 40 and the first lower shield layer 41) and the MR part 2, a first laminated in this order. On top of the upper shield layer 3 (on top of the first upper shield layer 31), a first antiferromagnetic layer 5 that was made of IrMr was formed. The thickness of the first antiferromagnetic layer 5 was 50 Å so that the blocking temperature ($Tb_5$) of the first antiferromagnetic layer 5 was 200° C.

Then, with respect to the multilayer body that is obtained by laminating the layers up to the first antiferromagnetic layer 5, a second annealing treatment is performed in which, while a magnetic field (3 kOe) is applied in a direction of a predetermined angle θ3, heating is performed at a temperature (210° C.) that is higher than the blocking temperature $Tb_5$ of the first antiferromagnetic layer 5 and lower than the blocking temperature $Tb_6$ of the second antiferromagnetic layer 6.

Further, when viewed from an ABS side, an insulation layer made of $Al_2O_3$ was formed on both sides in a track width direction of the MR part 2.

The so-formed magnetoresistive effect element of Example 2 was used to detect a signal magnetic field from a medium that corresponds to a magnetic field in a range from −400 Oe to 400 Oe, and it was confirmed that a practically-usable magnetoresistive change is obtained.

TABLE 2

| Lamination Structure | | | Constituent Material of Each Layer | Thickness (Å) |
|---|---|---|---|---|
| First Antiferromagnetic Layer (5) | | | IrMn | 50 |
| Upper Shield Layer (3) | First Upper Shield Layer (31) | | NiFe | 125 |
| | Upper Nonmagnetic Layer (30) | | Ru | 8 |
| | Second Upper Shield Layer (32) | | NiFe | 125 |
| Magnetoresistive Effect Part (2) | First Exchange Coupling Function Gap Layer (23) | First Exchange Coupling Transmitting Layer (231A) | Ru | 8 |
| | | First Gap Adjustment Layer (232A) | CoFe | 10 |
| | | Second Exchange Coupling Transmitting Layer (231B) | Ru | 8 |
| | | Second Gap Adjustment Layer (232B) | CoFe | 10 |
| | | Exchange Coupling Adjustment Layer (233) | Cu | 9 |
| | Sensor Region | First Ferromagnetic Layer (21) | 90CoFe*[2] | 30 |
| | | Nonmagnetic Intermediate Layer (20) | Cu | 5 |
| | | | ZnO | 18 |
| | | | Cu | 5 |
| | | Second Ferromagnetic Layer (22) | 90CoFe*[2] | 30 |
| | Second Exchange Coupling Function Gap Layer (24) | Exchange Coupling Adjustment Layer (243) | Cu | 9 |
| | | First Gap Adjustment Layer (242A) | CoFe | 10 |
| | | First Exchange Coupling Transmitting Layer (241A) | Ru | 8 |
| | | Second Gap Adjustment Layer (242B) | CoFe | 10 |
| | | Second Exchange Coupling Transmitting Layer (241B) | Ru | 8 |
| Lower Shield Layer (4) | First Lower Shield Layer (41) | | NiFe | 125 |
| | Lower Nonmagnetic Layer (40) | | Ru | 8 |
| | Second Lower Shield Layer (42) | | NiFe | 125 |
| Second Antiferromagnetic Layer (6) | | | IrMn | 100 |

*[2] In Table 2, "90CoFe" means a cobalt-iron alloy containing 90 atomic percent of cobalt.

Experimental Example 3

A spin stand on which a magnetic head was mounted was used to evaluate recording and reproducing characteristics (R/W characteristics). As the magnetic head, a combination of a single magnetic pole head that had a recording track width of 60 nm and a MR head that contained the magnetoresistive effect element of the above Example 1 and Example 2 and had a reproducing track width of 40 nm was used.

Measurement wasperformed at a condition that a disk was rotated at 5400 rpm at a constant position of a radius position of 22.3 mm.

As a medium SNR, a value of a signal-to-noise ratio (S/Nm) of a differential waveform after passing through a differentiating circuit was evaluated. Here, S was an output at 299 kfci, and Nm was a RMS (Root Mean Square) value at 793 kfci. Further, a track average signal amplitude (TAA: Track Average Amplitude) at 299 kfci was evaluated.

The results are illustrated in Table 3.

TABLE 3

| | TAA (mV) | S/Nm (dB) |
|---|---|---|
| Example 1 | 2.7 | 14.7 |
| Example 2 | 2.6 | 16.3 |

As illustrated in Table 3, while the magnetoresistive effect elements of Example 1 and Example 2 all showed substantially the same TAA, an improvement in S/Nm of the magnetoresistive effect element of Example 2 was seen. From this result, it was confirmed that, as in Example 2, by configuring each of the upper shield layer and the lower shield layer with two shield layers with a nonmagnetic layer made of Ru and the like interposed therebetween, the occurrence of quality degradation of a recording medium due to a leakage magnetic field from the upper shield layer and the lower shield layer could be more effectively suppressed.

The present invention is applicable to the industry of magnetic disk device that are provided with a magnetoresistive effect element for reading magnetic field intensity of a magnetic recording medium and the like as a signal.

What is claimed is:

1. A magnetoresistive effect element of a current perpendicular to plane (CPP) structure in which a sense current is applied in a lamination direction, the magnetoresistive effect element comprising:
    a magnetoresistive effect part; and
    an upper shield layer and a lower shield layer that are laminated and formed in a manner sandwiching the magnetoresistive effect part from above and below, wherein the magnetoresistive effect part comprises
    a nonmagnetic intermediate layer, and
    a first ferromagnetic layer and a second ferromagnetic layer that are laminated and formed in a manner sandwiching the nonmagnetic intermediate layer from above and below,
the upper shield layer and the lower shield layer have inclined magnetization structures in which magnetizations of the upper shield layer and the lower shield layer are respectively inclined with respect to a track width direction,
the magnetizations of the upper shield layer and the lower shield layer are mutually substantially orthogonal,
the first ferromagnetic layer is indirectly magnetically coupled with the upper shield layer via a first exchange coupling function gap layer that is positioned between the first ferromagnetic layer and the upper shield layer, such that a magnetization of the first ferromagnetic layer is inclined with respect to the track width direction,
the second ferromagnetic layer is indirectly magnetically coupled with the lower shield layer via a second exchange coupling function gap layer that is positioned between the second ferromagnetic layer and the lower shield layer, such that a magnetization of the second ferromagnetic layer is inclined with respect to the track width direction,
the first ferromagnetic layer has a rectangular shape which has two sides parallel with respect to the track width direction and two sides orthogonal with respect to the track width direction when it is viewed from the upper part of the lamination direction,
the second ferromagnetic layer has a rectangular shape which has two sides parallel with respect to the track width direction and two sides orthogonal with respect to the track width direction when it is viewed from the upper part of the lamination direction, and
the magnetoresistive effect element does not have an applying part to apply the bias magnetic field with respect to the first ferromagnetic layer and the second ferromagnetic layer.

2. The magnetoresistive effect element according to claim 1, wherein
    the upper shield layer comprises
        an upper nonmagnetic layer; and
        a first upper shield layer and a second upper shield layer that are laminated and formed in a manner sandwiching the upper nonmagnetic layer from above and below,
    the first upper shield layer and the second upper shield layer are exchange-coupled via the upper nonmagnetic layer in such a manner that magnetizations of the first upper shield layer and the second upper shield layer are respectively inclined with respect to the track width direction and are mutually antiparallel,
    the magnetizations of the first upper shield layer and the lower shield layer are mutually substantially orthogonal,
    the first exchange coupling function gap layer is positioned between the first ferromagnetic layer and the first upper shield layer, and
    the first ferromagnetic layer is indirectly magnetically coupled with the first upper shield layer via the first exchange coupling function gap layer.

3. The magnetoresistive effect element according to claim 1, wherein
    the lower shield layer comprises
        a lower nonmagnetic layer; and
        a first lower shield layer and a second lower shield layer that are laminated and formed in a manner sandwiching the lower nonmagnetic layer from above and below,
    the first lower shield layer and the second lower shield layer are exchange-coupled via the lower nonmagnetic layer in such a manner that magnetizations of the first lower shield layer and the second lower shield layer are respectively inclined with respect to the track width direction and are mutually antiparallel,
    the magnetizations of the second lower shield layer and the upper shield layer are mutually substantially orthogonal,
    the second exchange coupling function gap layer is positioned between the second ferromagnetic layer and the second lower shield layer, and
    the second ferromagnetic layer is indirectly magnetically coupled with the second lower shield layer via the second exchange coupling function gap layer.

4. The magnetoresistive effect element according to claim 1, wherein
    the upper shield layer comprises
        an upper nonmagnetic layer; and
        a first upper shield layer and a second upper shield layer that are laminated and formed in a manner sandwiching the upper nonmagnetic layer from above and below,
    the lower shield layer comprises
        a lower nonmagnetic layer; and
        a first lower shield layer and a second lower shield layer that are laminated and formed in a manner sandwiching the lower nonmagnetic layer from above and below,
    the first upper shield layer and the second upper shield layer are exchange-coupled via the upper nonmagnetic layer in such a manner that magnetizations of the first upper shield layer and the second upper shield layer are respectively inclined with respect to the track width direction and are mutually antiparallel,
    the first lower shield layer and the second lower shield layer are exchange-coupled via the lower nonmagnetic layer in such a manner that magnetizations of the first lower shield layer and the second lower shield layer are respectively inclined with respect to the track width direction and are mutually antiparallel,
    the magnetizations of the first upper shield layer and the second lower shield layer are mutually substantially orthogonal,
    the first exchange coupling function gap layer is positioned between the first ferromagnetic layer and the first upper shield layer,
    the second exchange coupling function gap layer is positioned between the second ferromagnetic layer and the second lower shield layer,
    the first ferromagnetic layer is indirectly magnetically coupled with the first upper shield layer via the first exchange coupling function gap layer, and
    the second ferromagnetic layer is indirectly magnetically coupled with the second lower shield layer via the second exchange coupling function gap layer.

5. The magnetoresistive effect element according to claim 1, wherein
    the first exchange coupling function gap layer sequentially includes, from the upper shield layer side, an exchange coupling transmitting layer, a gap adjustment layer and an exchange coupling adjustment layer, and the second exchange coupling function gap layer sequentially includes, from the lower shield layer side, an exchange coupling transmitting layer, a gap adjustment layer and an exchange coupling adjustment layer.

6. The magnetoresistive effect element according to claim 1, wherein the first exchange coupling function gap layer sequentially includes, from the upper shield layer side, a first exchange coupling transmitting layer, a first gap adjustment layer, a second exchange coupling transmitting layer, a second gap adjustment layer and an exchange coupling adjustment layer, and the second exchange coupling function gap layer sequentially includes, from the lower shield layer side, a first exchange coupling transmitting layer, a first gap adjustment layer, a second exchange coupling transmitting layer, a second gap adjustment layer and an exchange coupling adjustment layer.

7. The magnetoresistive effect element according to claim 1, wherein the magnetoresistive effect element is sandwiched from above and below by a first antiferromagnetic layer that is adjacent to the upper shield layer and a second antiferromagnetic layer that is adjacent to the lower shield layer, the magnetization of the upper shield layer is pinned due to an exchange coupling between the upper shield layer and the first antiferromagnetic layer, and the magnetization of the lower shield layer is pinned due to an exchange coupling between the lower shield layer and the second antiferromagnetic layer.

8. The magnetoresistive effect element according to claim 7, wherein a blocking temperature of the second antiferromagnetic layer is higher than a blocking temperature of the first antiferromagnetic layer.

9. A thin film magnetic head comprising:

a medium-opposing surface opposing a recording medium; and the magnetoresistive effect element according to claim 1 that is arranged in a vicinity of the medium-opposing surface for detecting a signal magnetic field from the recording medium.

10. A head gimbal assembly comprising:

a slider that contains the thin film magnetic head according to claim 9 and is arranged opposing a recording medium; and a suspension that elastically supports the slider.

11. A magnetic disk device comprising:

a slider that contains the thin film magnetic head according to claim 9 and is arranged opposing a recording medium; and a positioning device that supports the slider and positions the slider with respect to the recording medium.

12. The magnetoresistive effect element according to claim 1, wherein the magnetizations of the first ferromagnetic layer and the second ferromagnetic layer are mutually substantially orthogonal.

13. The magnetoresistive effect element according to claim 1, wherein the upper shield layer has a rectangular shape which has two sides parallel with respect to the track width direction and two sides orthogonal with respect to the track width direction when it is viewed from the upper part of the lamination direction, the lower shield layer has a rectangular shape which has two sides parallel with respect to the track width direction and two sides orthogonal with respect to the track width direction when it is viewed from the upper part of the lamination direction.

* * * * *